(12) United States Patent
Nishihara

(10) Patent No.: US 8,344,441 B2
(45) Date of Patent: Jan. 1, 2013

(54) NONVOLATILE SEMICONDUCTOR MEMORY DEVICE

(75) Inventor: Kiyohito Nishihara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 231 days.

(21) Appl. No.: 12/839,723

(22) Filed: Jul. 20, 2010

(65) Prior Publication Data

US 2011/0049604 A1    Mar. 3, 2011

(30) Foreign Application Priority Data

Aug. 31, 2009    (JP) .................................. 2009-200425

(51) Int. Cl.
*H01L 29/788* (2006.01)
(52) U.S. Cl. .................................. 257/316; 257/E29.03
(58) Field of Classification Search .................. 257/316, 257/E29.3
See application file for complete search history.

(56) References Cited

U.S. PATENT DOCUMENTS

| | | | |
|---|---|---|---|
| 7,388,784 | B2 | 6/2008 | Matsunaga et al. |
| 2003/0123307 | A1* | 7/2003 | Lee et al. ...................... 365/200 |
| 2007/0002622 | A1* | 1/2007 | Matsunaga et al. ...... 365/185.11 |
| 2009/0091040 | A1 | 4/2009 | Uchida et al. |

FOREIGN PATENT DOCUMENTS

| | | |
|---|---|---|
| JP | 2006-351951 | 12/2006 |
| JP | 2009-54941 | 3/2009 |

OTHER PUBLICATIONS

U.S. Appl. No. 13/255,743, filed Sep. 6, 2011, Nishihara.

* cited by examiner

*Primary Examiner* — Eugene Lee
*Assistant Examiner* — Elias M Ullah
(74) *Attorney, Agent, or Firm* — Oblon, Spivak, McClelland, Maier & Neustadt, L.L.P.

(57) ABSTRACT

According to one embodiment, a nonvolatile semiconductor memory device includes: a semiconductor substrate; an element isolation insulator formed in an upper portion of the semiconductor substrate and dividing the upper portion into first and second active areas extending in a first direction; a first contact connected to the first active area; and a second contact connected to the second active area. Each of the first and second active area includes: a first portion connected to one of the first contact and the second contact; and a second portion having an upper surface being placed lower than an upper surface of the first portion. The first contact and the second contact are mutually shifted in the first direction. The first portion of the first active area is disposed adjacent to the second portion of the second active area.

17 Claims, 23 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-200425, filed on Aug. 31, 2009; the entire contents of which are incorporated herein by reference.

FIELD

Embodiments described herein relate generally to a nonvolatile semiconductor memory device.

BACKGROUND

Previously, a NAND-type memory device has been used as a nonvolatile semiconductor memory device. The NAND-type memory device includes a plurality of divided line-shaped portions in an upper layer portion of a silicon substrate, and the line-shaped portions are used as active areas. Multiple memory cells are formed in respective active areas, and a pair of selection gate electrodes are provided on both sides of the multiple memory cells. Moreover, a bit line and a source line are provided above the silicon substrate, and are connected to both sides of the pair of the selection gate electrodes. Here, at least the bit line is connected to the active area via a contact.

However, advanced shrinking of the NAND-type memory device causes reduction of margin for short circuit between adjacent contacts. More specifically, shift of a position of contact due to fluctuation of a manufacturing process may cause a problem of short-circuit between two contacts connected to adjacent active areas. Hence, a technique (for example, refer to FIG. 1 in JP-A 2009-54941 (Kokai)) has been proposed, in which contacts are arranged in a zigzag alignment as viewed from above.

However, although the margin for short circuit between the contacts can be improved by arranging the contacts in the zigzag alignment, the margin for short circuit between the contact and the active area cannot be improved. More specifically, on reduction of a spacing between active areas, short circuit badly occurs between a contact connected to a certain active area and another active area disposed next to the active area. Therefore, shrinking of the NAND-type memory device causes to reduce a yield of products.

DETAILED DESCRIPTION

In general, According to one embodiment, there is provided a nonvolatile semiconductor memory device. The device includes: a semiconductor substrate; an element isolation insulator formed in an upper portion of the semiconductor substrate and dividing the upper portion into a first active area extending in a first direction and a second active area extending in the first direction; a first contact provided above the first active area and having a lower end portion connected to the first active area; and a second contact provided above the second active area and having a lower end portion connected to the second active area. Each of the first active area and the second active area includes: a first portion connected to one of the first contact and the second contact; and a second portion having an upper surface being placed lower than an upper surface of the first portion. The first contact and the second contact are mutually shifted in the first direction. The first portion of the first active area is disposed adjacent to the second portion of the second active area.

According to one other embodiment, there is provided a nonvolatile semiconductor memory device. The device includes: a semiconductor substrate; an element isolation insulator formed in an upper portion of the semiconductor substrate and dividing the upper portion into a first active area extending in a first direction and a second active area extending in the first direction; a first contact provided above the first active area and having a lower end portion connected to the first active area; and a second contact provided above the second active area and having a lower end portion connected to the second active area. The first contact and the second contact are mutually shifted in the first direction. And a first region in an upper surface of the first active area being in contact with the first contact is placed higher than a second region in an upper surface of the second active area being same as a position of the first region in the first direction.

Embodiments of the invention will now be described with reference to the drawings.

First, a first embodiment of the invention is described.

The first embodiment is an embodiment showing schematically a feature of the invention. A detail of the configuration of the nonvolatile semiconductor memory device and a manufacturing method will be described in detail with respect to a fifth embodiment described later.

Figure 1:
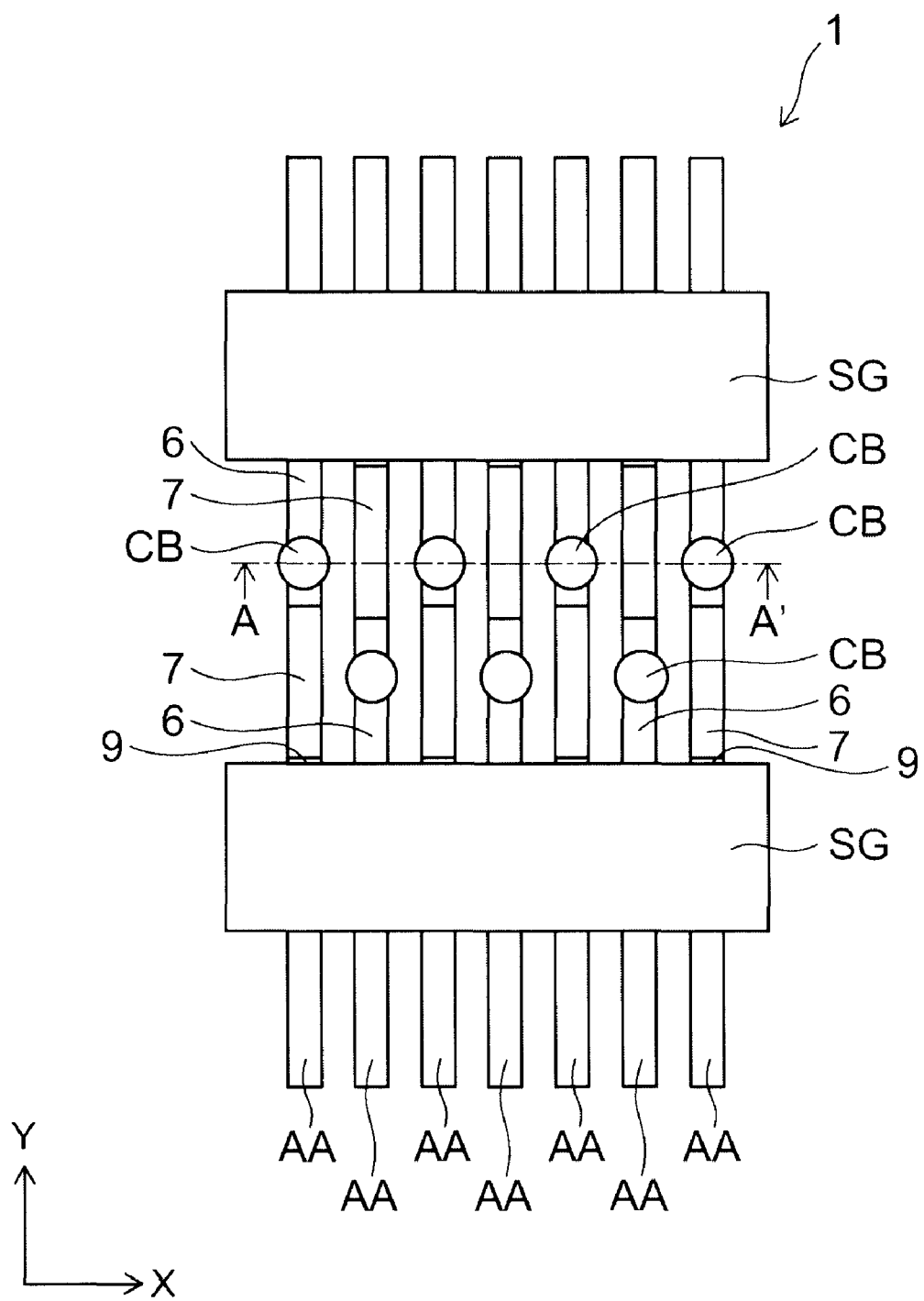
FIG. 1 is a block diagram illustrating a nonvolatile semiconductor memory device according to a first embodiment.

FIG. 1 is a plan view illustrating a nonvolatile semiconductor memory device according to this embodiment.

Figure 2:
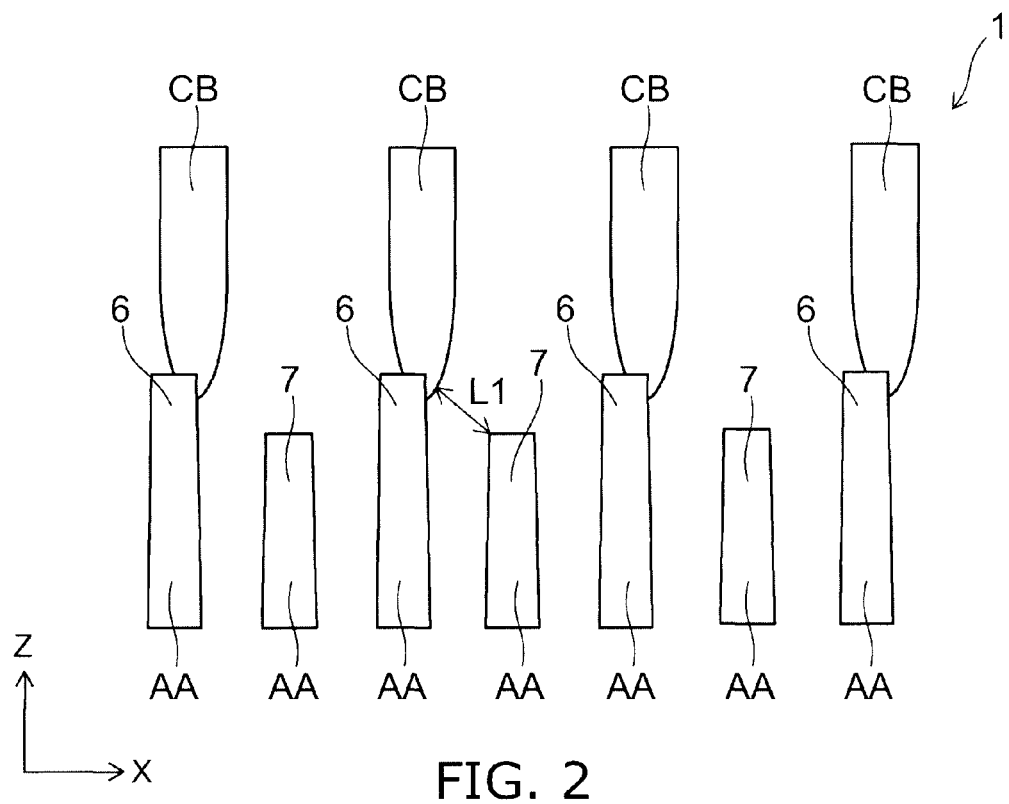
FIG. 2 is a cross-sectional view taken along A-A' line shown in FIG. 1.

FIG. 2 is a cross-sectional view taken along A-A' line shown in FIG. 1.

Figure 3:
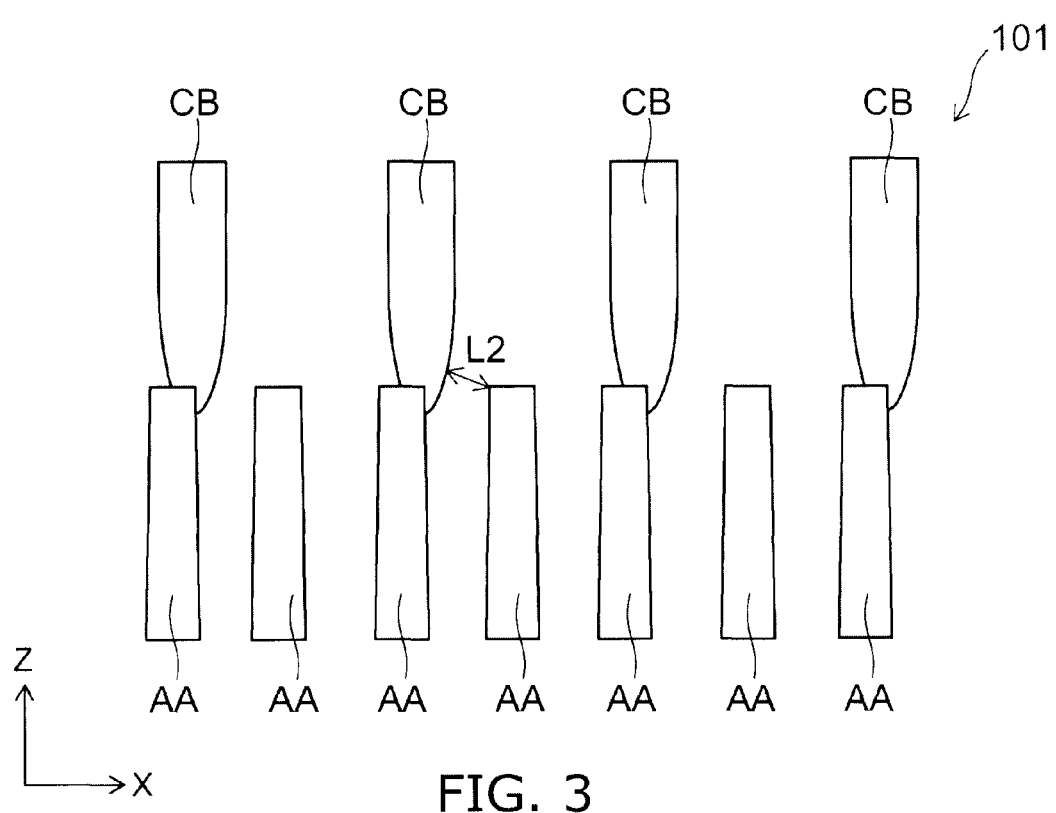
FIG. 3 is a cross-sectional view illustrating a nonvolatile semiconductor memory device according to a comparative example of the first embodiment.

FIG. 3 is a cross-sectional view illustrating a nonvolatile semiconductor memory device according to a comparative example of this embodiment.

Figure 4:
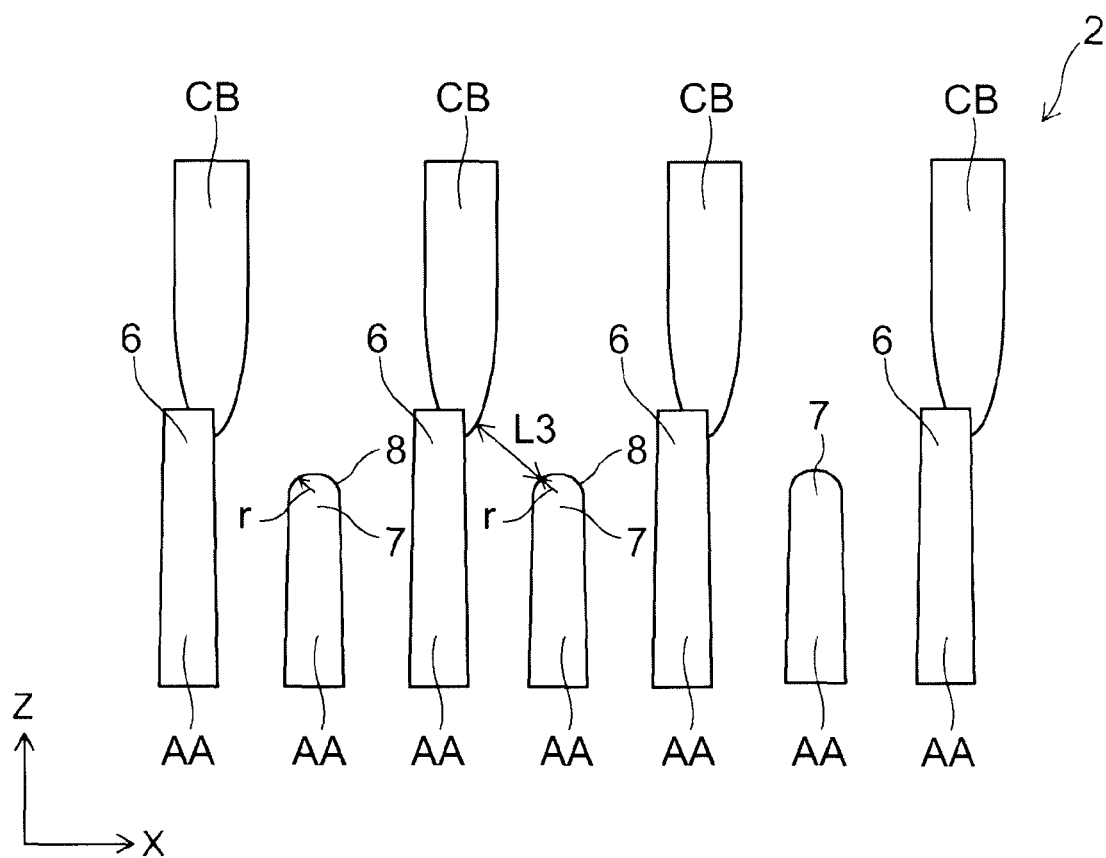
FIG. 4 is a cross-sectional view illustrating a nonvolatile semiconductor memory device according to a second embodiment.
Figure 5:
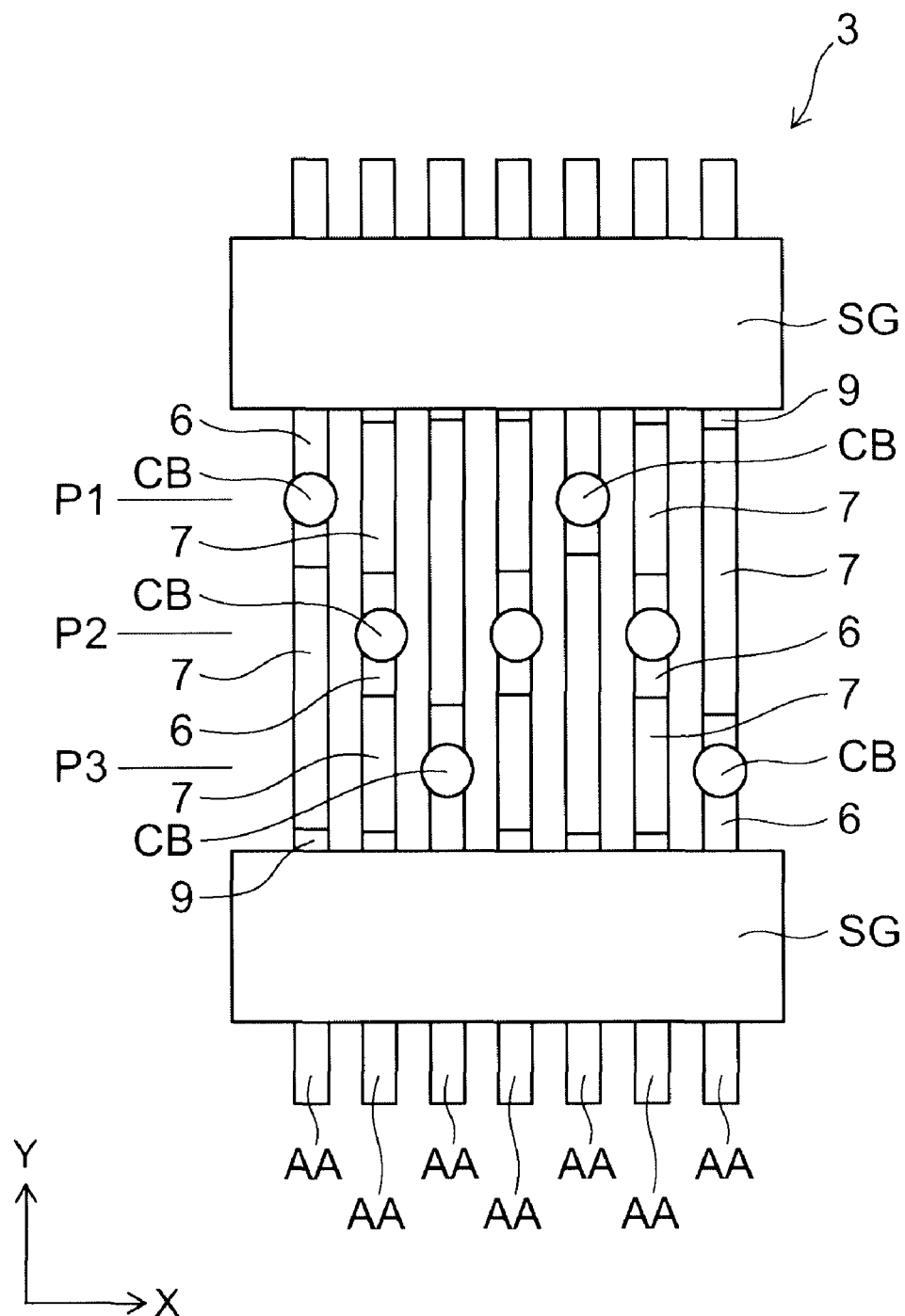
FIG. 5 is a plan view illustrating a nonvolatile semiconductor memory device according to a third embodiment.
Figure 6:
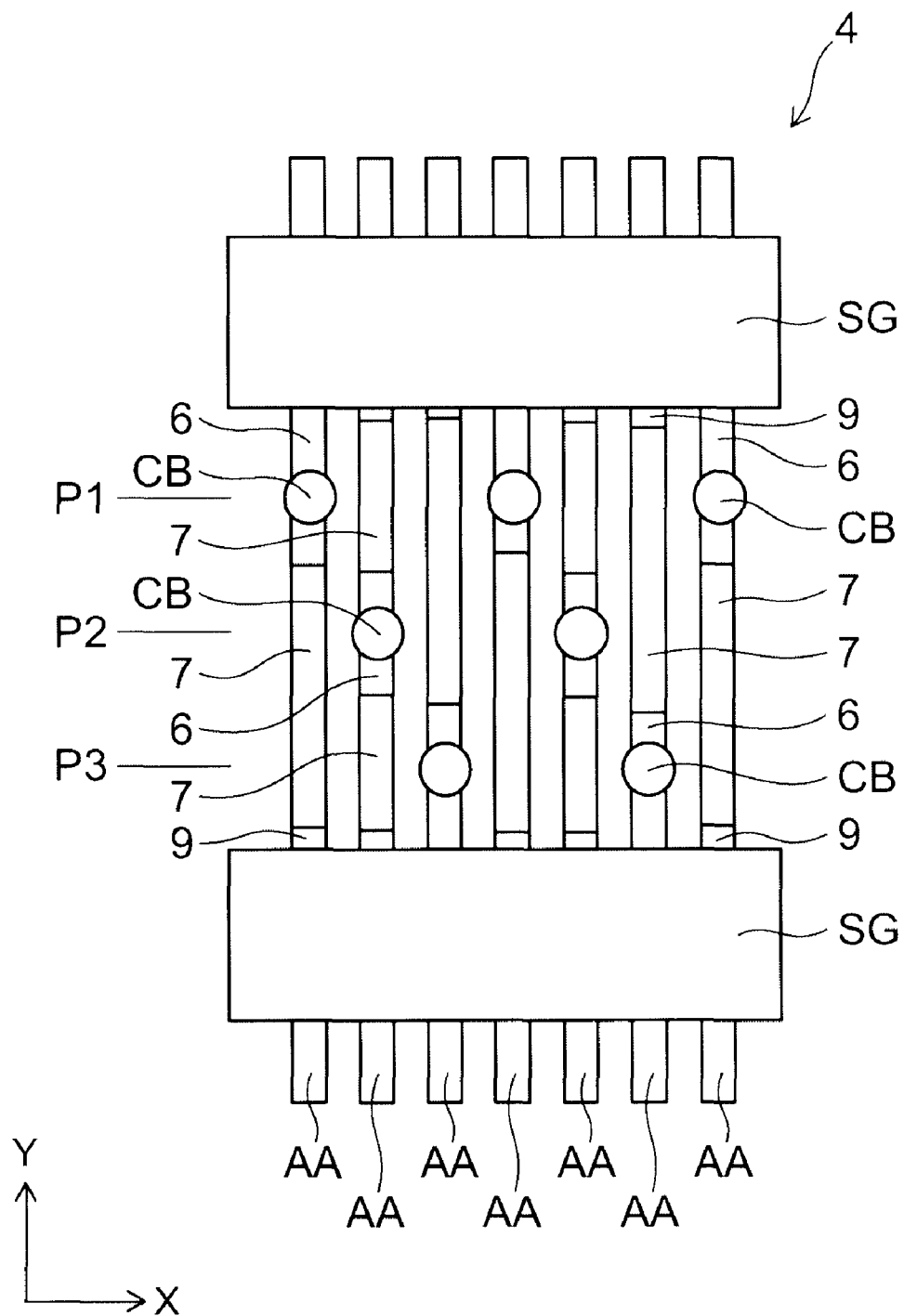
FIG. 6 is a plan view illustrating a nonvolatile semiconductor memory device according to a fourth embodiment.

FIG. 3 shows a cross-section corresponding to the cross-section in FIG. 2. FIG. 1 to FIG. 3 illustrate only conductive portions for simplifying the drawing and omit insulating portions. FIG. 4 to FIG. 6 described later are the same as FIG. 1 to FIG. 3.

As shown in FIG. 1 and FIG. 2, the nonvolatile semiconductor memory device 1 (hereinafter, merely refer to "device 1" as well) according to this embodiment is a NAND-type flash memory. The device 1 is provided with a silicon substrate. A plurality of element isolation insulators are formed of STI (shallow trench isolation, not shown in the drawing) and extend in one direction in an upper layer portion of the silicon substrate. The upper layer portion of the silicon substrate is divided into a plurality of active areas AA by the element isolation insulators.

An XYZ orthogonal coordination system will now be introduced for convenience of description in the specification. That is, a direction in which the element isolation insulators and the active areas is taken as a Y direction out of directions parallel to an upper surface of the silicon substrate, and a direction perpendicular to the Y direction is taken as a X direction. A direction perpendicular to the upper surface of the silicon substrate is taken as a Z direction.

The device 1 is configured with memory strings connecting in series a plurality of memory cells along the active areas. A pair of selection gate electrodes SG are provided on both sides of the plurality of cells included in the memory strings above the silicon substrate. The memory strings are provided to connect between bit line contacts CB connected to bit lines (not shown) extending in the Y direction and source lines (not shown) extending in the X direction.

The bit lines are disposed immediately above the active areas AA and each of the bit lines is connected to each of the active areas AA via one of the bit line contacts CB. That is, each of the bit line contacts CB is disposed above the each of the active areas AA, its lower end portion is connected to the active area and its upper end portion is connected to the bit line. The bit line contact CB is illustratively column-shaped, and the lower end portion is thinner than another portion.

The bit line contact CB is connected to a portion of the active area AA placed between two selection gate electrodes SG included in mutually different memory strings. Moreover, the bit line contacts CB are arranged in a zigzag alignment as viewed from above (Z direction). That is, positions in the Y direction of two bit line contacts CB connected to the active areas next to each other are mutually shifted.

A center axis of the bit line contact CB is designed to be placed at the center line of the active area AA, however, the center axis of the bit line contact CB may shift from the center line of the active area AA because of fluctuation in a manufacturing process.

In the device 1, an upper surface of a portion 7 which has the same position in the Y direction as a portion 6 of a certain active area AA is placed lower, more specifically placed on the silicon substrate side, than an upper surface of the portion 6 connected to the bit line contact CB above the certain active area AA. That is, the portion 7 is engraved to the portion 6. The portion 6 is a portion including a region immediately below the bit line contact CB, and hence the portion 6 is arranged in a zigzag alignment like the bit line contact CB as viewed from above. In other words, it is said that the each active area AA includes the portion 6 connected to the bit line contact CB and the portion 7 having the upper surface being placed lower than the upper surface of the portion 6, and the portion 6 of one active area AA is disposed adjacent to the portion 7 of the another active area AA disposed adjacent to the one active area AA. In this embodiment, for example, a portion excluding the portion 6 from portions placed between two selection gate electrodes included in mutually different memory strings in the active area AA serves as the portion 7. Therefore, the portion 7 is arranged in a zigzag alignment to compensate the portion 6.

Here, the portion 6 is a partial region of the active area AA, and a region having a prescribed length in the Y direction in addition to a portion connected to the bit line contact CB. The prescribed length is favorably at least a length such that the bit line contact CB is in contact with the upper surface of the portion 6, even if misalignment in the Y direction occurs during formation of the bit line contact CB. More specifically, the portion 6 extends from the region immediately below the bit line contact CB to both sides of the region in the Y direction.

The portion 6 and the portion 7 are arranged in a zigzag alignment, and hence the portion 6 and the portion 7 are also arranged in the Y direction. Furthermore, the portion 6 and the portion 7 are in contact with each other in the each adjacent active area AA in the X direction.

Next, the operation effect of this embodiment is described.

As described above, in the device 1 according to this embodiment, the upper surface of the portion 7 placed on both sides of the portion 6 in the X direction is hollow with respect to the upper surface of the portion 6 connected to the bit line contact CB above the active area AA. Therefore, a shortest distance L1 between the bit line contact CB connected to the portion 6 and the adjacent portion 7 is large. Thereby, a short-circuit margin can be ensured between the bit line contact CB and the active area AA. A diameter of the bit line contact CB can be enlarged, and hence a contact resistance between the bit line contact CB and the active area AA can be reduced. Furthermore, a width of an upper portion of the portion 7, namely, a length in the X direction is nearly the same as a width of an upper portion of the portion 6. Therefore, a cross-sectional area of an upper portion of the active area AA where a cell current mainly flows is nearly the same as that of the portion 6 and the portion 7. Hence, formation of the portion 7 does not reduce the cell current flowing the active area AA.

In contrast, as shown in FIG. 3, in a nonvolatile semiconductor memory device 101 according to a comparative example of this embodiment, a whole upper surface of the active area AA is flat. Therefore, a shortest distance L2 between the bit line contact CB connected to the portion 6 of the active area AA and the adjacent portion 7 is smaller than the shortest distance L1 in the device 1. Hence, it is difficult to ensure the short-circuit margin between the bit line contact CB and the active area AA in the nonvolatile semiconductor memory device 101.

Here, in the comparative example shown in FIG. 3, it is contemplated to improve the short-circuit margin between the bit line contact CB and the active area AA by thinning the bit line contact CB. However, this causes the contact resistance between the bit line contact CB and the active area AA to increase and the cell current to reduce. In contrast, in the device 1 of this embodiment, the short-circuit margin between the bit line contact CB and the active area AA can be ensured without thinning the bit line contact CB.

It is noted that the portion 7, namely, the portion having the hollow formed in the active area AA is only necessary to be provided at least both sides of the portion 6 connected to the bit line contact CB. Therefore, portions excluding the portion 6 are not necessary to be entirely hollow of portions placed between the selection gate electrodes SG. For example, there may be a portion 9 having an upper portion which is equal to that of the portion 6 in FIG. 1.

Next, a second embodiment of the invention is described.

FIG. 4 is a cross-sectional view illustrating a nonvolatile semiconductor memory device according to this embodiment.

Here, FIG. 4 shows a cross-section corresponding to that in FIG. 2 in the first embodiment previously described.

As shown in FIG. 4, the nonvolatile semiconductor memory device 2 (hereinafter, merely refer to "device 2" as well) according to this embodiment is different from the device 1 (see FIG. 1) of the first embodiment previously described in the point that an edge portion 8 of the portion 7 of the active area AA between the upper surface and a side surface perpendicular to the X direction is rounded. That is, a curvature radius r of the edge portion 8 of the portion 7 is larger than a curvature radius of an edge portion of the portion 6. The configuration other than the above of this embodiment is the same as that of the first embodiment described above.

Next, the operation effect of this embodiment is described.

According to this embodiment, the edge portion 8 of the portion 7 in the device 2 is rounded, and hence a shortest distance L3 between the bit line contact CB in the device 2 and the adjacent portion 7 is larger than the shortest distance L1 in the device 1. The operation effect other than the above of this embodiment is the same as that of the first embodiment described above.

Next, a third embodiment of the invention is described.

FIG. 5 is a plan view illustrating a nonvolatile semiconductor memory device according to this embodiment.

As shown in FIG. 5, the nonvolatile semiconductor memory device 3 (hereinafter, merely refer to "device 3" as well) according to this embodiment is different from the device 1 (see FIG. 1) previously described in disposition of the bit line contact CB. Hence, disposition of the portion 6 placed immediately below the bit line contact CB is also different. Therefore, disposition of the portion 7 is also different from that of the device 1.

More specifically, also in this embodiment, like the first embodiment previously described, the bit line contact CB is disposed between two selection gate electrodes included mutually different memory strings, however, in this embodiment, the bit line contact CB is disposed at three positions in the Y direction, one is a position P1 on one selection gate electrode side, another one is a position P2 on a middle point, and still another one is a position P3 on the other selection gate electrode side. The disposition is such that reciprocation between the position P1 and the position P3 is performed in the order of the positions P1, P2, P3, P2, P1, P2, P3, . . . along the X direction.

According to this embodiment, with respect to the position P1 and the position P3, a distance between the bit line contacts CB in the X direction can be larger. As a result, the short-circuit margin between the bit line contacts can be large. The configuration and the operation effect other than the above of this embodiment is the same as those of the first embodiment.

Next, a fourth embodiment of the invention is described.

FIG. 6 is a plan view illustrating a nonvolatile semiconductor memory device according to this embodiment.

As shown in FIG. 6, the nonvolatile semiconductor memory device 4 (hereinafter, merely refer to "device 4" as well) according to this embodiment is different from the device 3 (see FIG. 3) according to the third embodiment previously described in arrangement of the bit line contacts CB. That is, the bit line contacts CB are repeatedly arranged in the order of the positions P1, P2, P3, P1, P2, P3, . . . along the X direction. According to this embodiment, the distance between the bit line contacts CB can be larger also at the position P2 in addition to the position P1 and the position P3. The configuration and the operation effect other than the above of this embodiment is the same as those of the third embodiment. In the third and fourth embodiments, the position of the bit line contact CB in the Y direction displaces periodically by taking the active areas AA of three or more arranged continuously as a base unit.

Next, a fifth embodiment of the invention is described.

This embodiment illustrates more specifically the first embodiment previously described.

A nonvolatile semiconductor memory device according to this embodiment is, for example, a NAND flash EEPROM (erasable programmable ROM).

Figure 7:
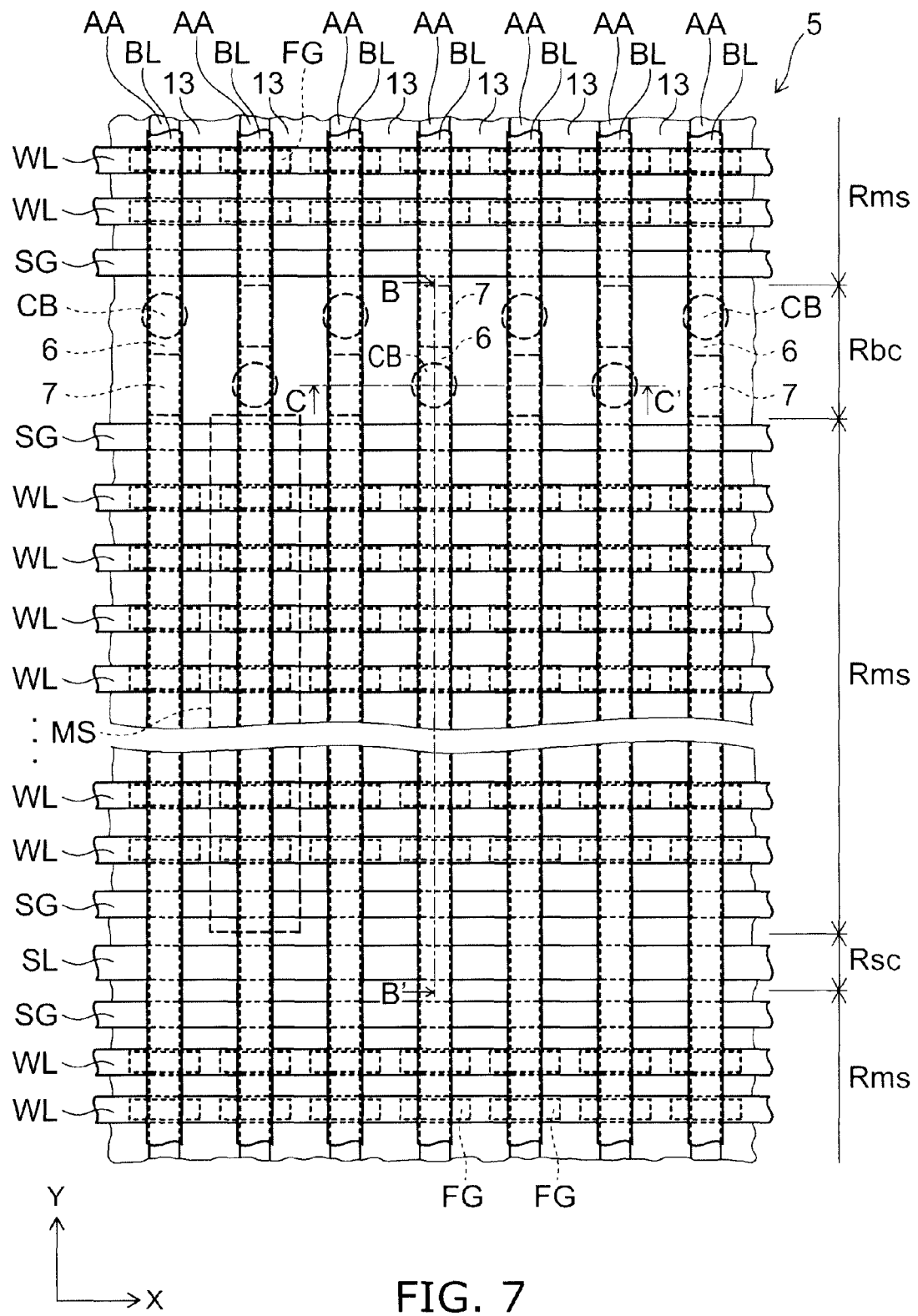
FIG. 7 is a plan view illustrating a nonvolatile semiconductor memory device according to a fifth embodiment.

FIG. 7 is a plan view illustrating the nonvolatile semiconductor memory device according to this embodiment.

Figure 8:
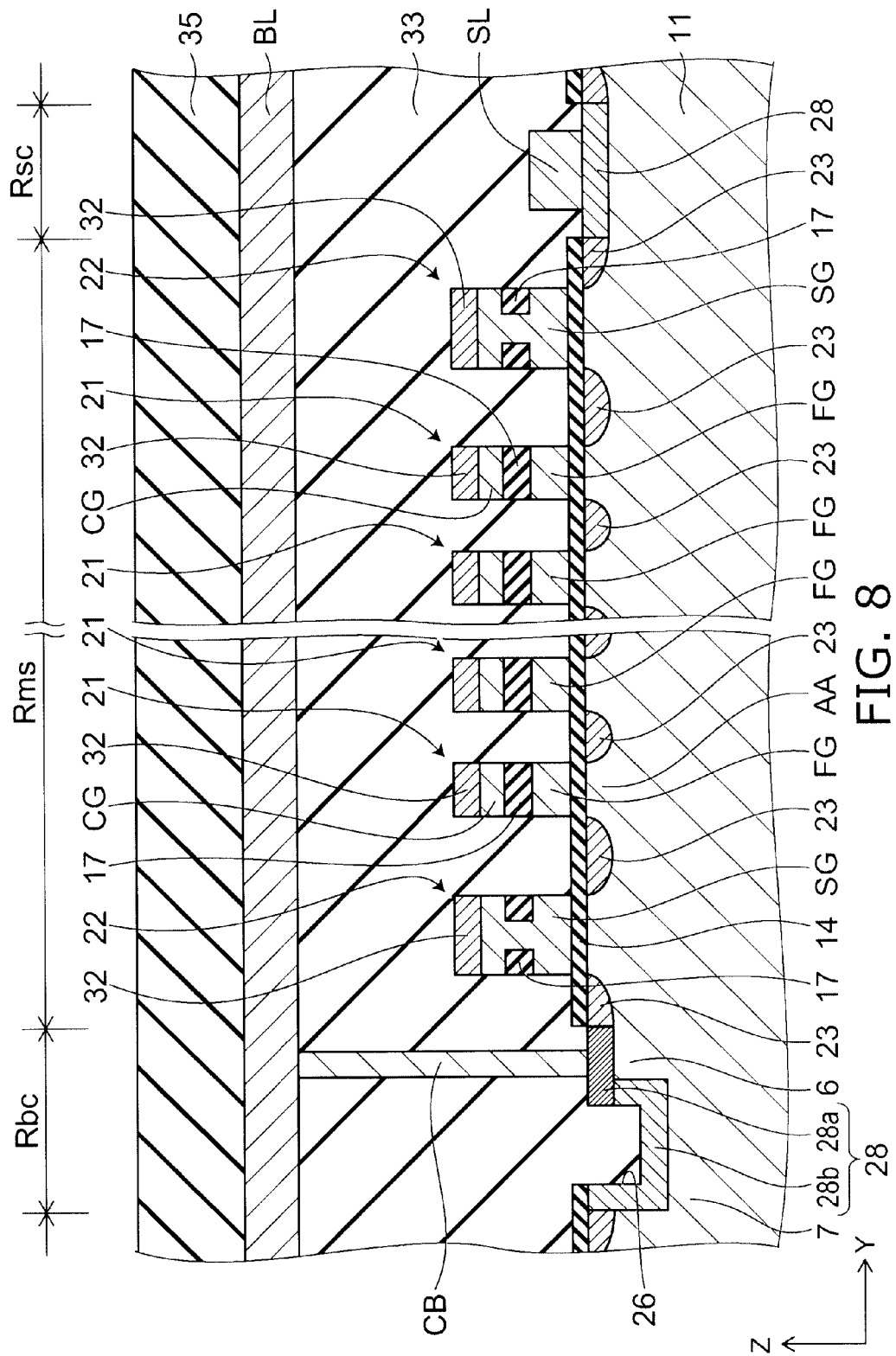
FIG. 8 is a cross-sectional view taken along B-B' line shown in FIG. 7.

FIG. 8 is a cross-sectional view taken along B-B' line shown in FIG. 7.

Figure 9:
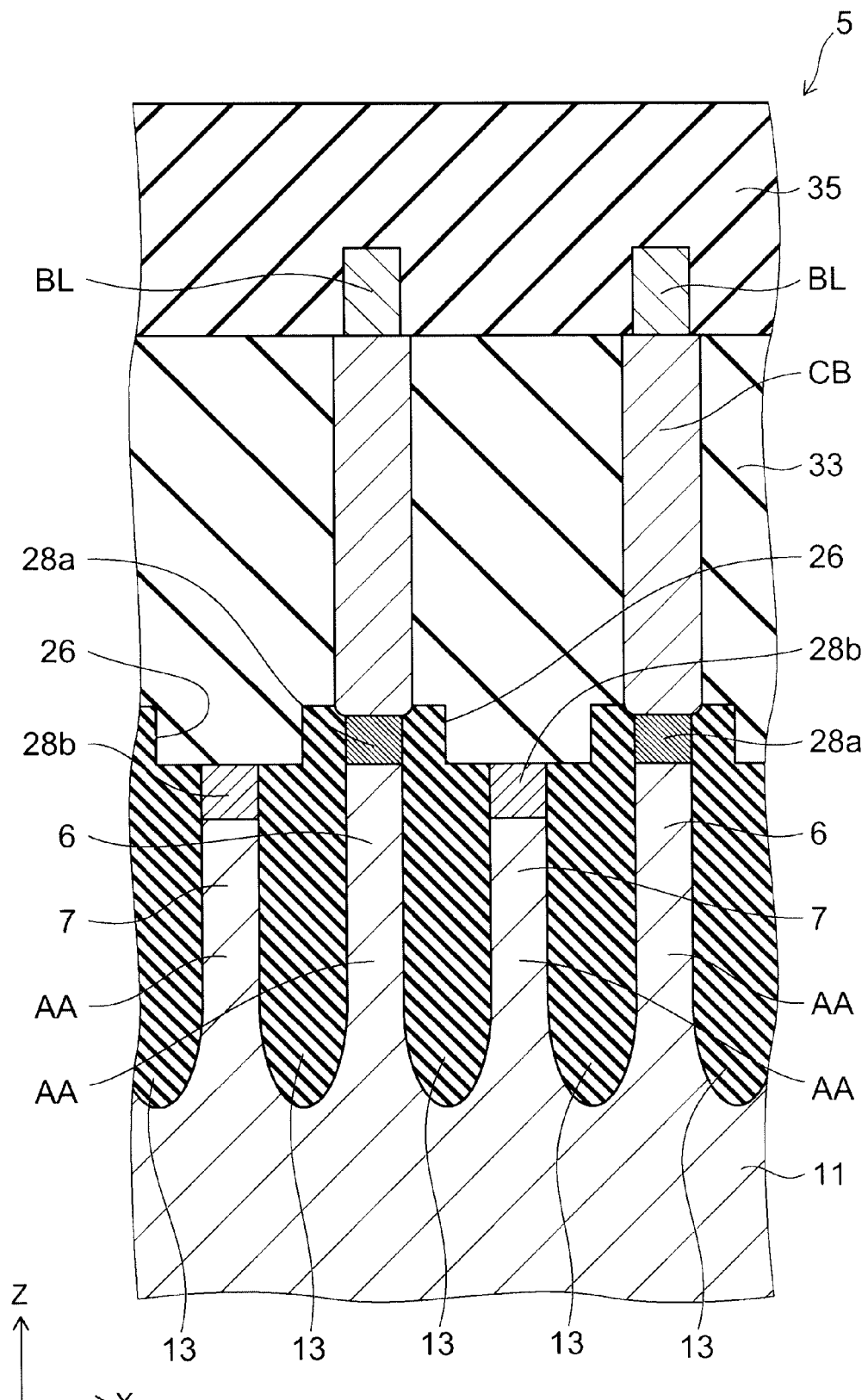
FIG. 9 is a cross-sectional view taken along C-C' line shown in FIG. 7.

FIG. 9 is a cross-sectional view taken along C-C' line shown in FIG. 7.

Figure 10:
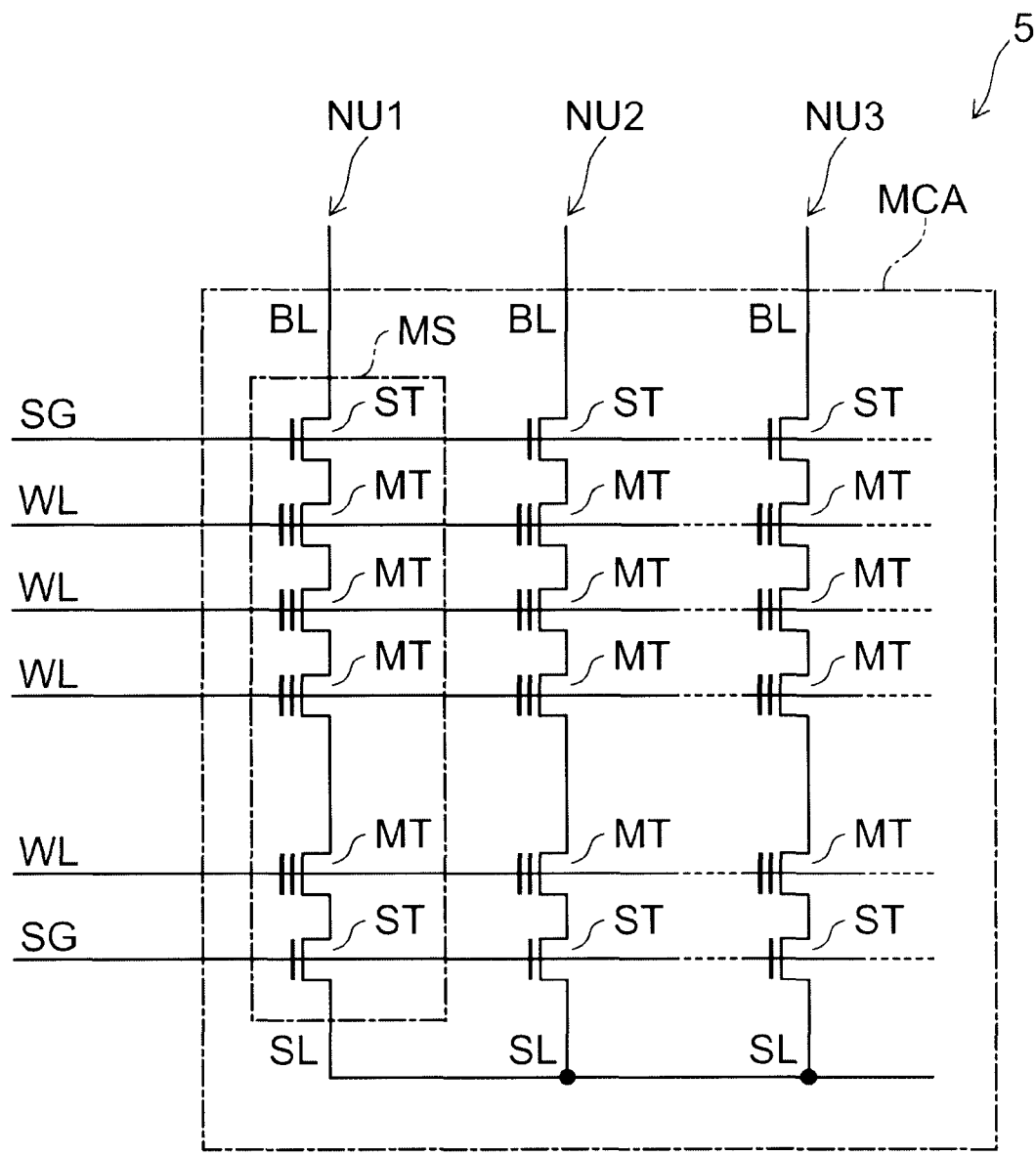
FIG. 10 is a circuit diagram illustrating the nonvolatile semiconductor memory device according to the fifth embodiment.

FIG. 10 is a circuit diagram illustrating the nonvolatile semiconductor memory device according to this embodiment.

AS shown in FIG. 7 to FIG. 9, in the nonvolatile semiconductor memory device 5 (hereinafter, merely refer to "device 5" as well) according to this embodiment, a silicon substrate 11 of a p-type conductivity is provided, an n-type well (not shown) is formed in the silicon substrate 11, and a p-type well (not shown) is formed in an upper portion of the n-type well. The p-type well is disposed in an interior of the n-type well as viewed from above (X direction). A plurality of memory string regions Rms are configured mutually isolated along the Y direction in the interior of the p-type well, and a region between the memory string regions Rms forms alternately a bit line contact region Rbc or a source line contact region Rsc. Moreover, a plurality of element isolation insulators 13 extending in the Y direction are formed in an upper portion of the p-type well so as to connect the plurality of memory string regions Rms, and an upper portion of the silicon substrate 11 is divided into the plurality of active areas AA by the element isolation insulators 13.

A tunneling insulating film 14 made of silicon oxide is formed on the silicon substrate 11 in the memory string regions Rms, and a plurality of stacked units 21 extending in the X direction are formed on the insulating film. A stacked unit 22 extending in the X direction is formed on both sides of a group including the plurality of stacked units 21 respectively one by one. The stacked units 21 and 22 are disposed to cross the plurality of active areas AA. Furthermore, an n-type diffusion layer 23 containing arsenic illustratively introduced is formed in a region excluding a region immediately below the stacked units 21 and 22 of the uppermost region of the silicon substrate 11.

A floating gate electrode FG made of a conductive material, for example, poly-silicon containing impurity introduced is provided as a charge storage member in each stacked unit 21. The floating gate electrode FG is divided along the X direction every active area AA. The stacked unit 21 is provided with an insulating film 17 made of silicon oxide to cover the floating gate electrode FG, and a control gate electrode CG made of a conductive material, for example, poly-silicon containing impurity introduced is provided on the insulating film to form a word line WL. The control gate electrode is provided in a line configuration extending in the X direction. A silicide layer 32 made of silicide, for example, cobalt silicide or tungsten silicide is formed in an upper portion of the control gate electrode CG.

On the other hand, the selection gate electrode SG extending in the X direction is provided in each stacked unit 22. The selection gate electrode SG is formed immediately above the active area AA via an opening 15 of the insulating film 17 to unify poly-silicon forming the floating gate electrode FG and poly-silicon forming the control gate electrode CG. Moreover, the silicide layer 32 is formed in an upper portion of the selection gate electrode SG.

The portion 6 and the portion 7 are disposed in each active area AA of the bit line contact region Rbc, and a recess 26 is formed in the portion 7 and the element isolation insulator 13 around the portion 7. Thereby, an upper surface of the portion 7 is placed lower than an upper surface of the portion 6. The portion 6 and the portion 7 are alternately disposed in adjacent active areas AA in the X direction. Hence, the portion 7 of the active area AA adjacent to a certain active area AA is disposed on both sides of the certain active area AA in the X direction as viewed from the portion 6. Furthermore, an $n^+$-type diffusion layer 28 illustratively containing arsenic introduced is formed in an uppermost portion of the active area AA as a diffusion region of impurity having a different conductivity type from the conductivity type in the active area AA. The portion is disposed contiguous to the portion 7 in the Y direction. The $n^+$-type diffusion layer 28 is formed continuously to the portion 6 and the portion 7 in each active area AA. An impurity concentration of a portion 28b formed in the portion 7 of the $n^+$-type diffusion layer 28 is lower than an impurity concentration of a portion 28a formed in the portion 6. Here, "impurity concentration" refers to an effective impurity concentration contributing to electrical conduction of its portion.

Arsenic is illustratively introduced into the uppermost portion of the active area AA to form the $n^+$-type diffusion layer 28 in the source line contact region Rsc as well. A source line SL made of a conductive material, for example, poly-silicon containing impurity introduced is formed on the silicon substrate 11. The source line SL crosses the plurality of active areas AA to be in contact with those active areas and is commonly connected to those active areas.

An inter-layer insulating film 33 illustratively made of silicon oxide is provided above the silicon substrate 11 to cover the stacked units 21 and 22 in the whole region of the memory string region Rms, the bit line contact region Rbc and the source line contact region Rsc. The bit line contact CB illustratively made of, for example, tungsten is buried in the inter-layer insulating film 33 on a part of the region immediately above the portion 6 of the active area AA. The lower end portion of the each bit line contact CB is connected to the each portion 6. As viewed from above, the bit line contacts CB are arranged in a zigzag alignment. A bit line BL extending in the Y direction is provided on the inter-layer insulating film 33 in a region including the region immediately above the active area AA. Each bit line BL is connected to the upper end portion of each bit line contact CB. An inter-layer insulating film 35 illustratively made of silicon oxide is provided above the inter-layer insulating film 33 to bury the bit line BL. In FIG. 7, the inter-layer insulating film 35, the inter-layer insulating film 33 and the tunneling insulating film 14 are omitted for convenience of illustration.

The bit line BL is connected to the $n^+$-type diffusion layer 28 in the portion 6 of the active area AA via the bit line contact CB in the bit line contact region Rbc of the device 5. On the other hand, the source line SL is directly connected to the $n^+$-type diffusion layer 28 of the active area AA in the source line contact region Rsc. A memory cell transistor MT is disposed on every overlapping portion of the control gate electrode CG and the active area AA in the memory string region Rms. Moreover, a selection transistor ST is formed on every overlapping portion of the selection gate electrode SG and the active area AA. Thereby, as shown in FIG. 10, a plurality of memory cell transistors MT are connected in series on every active area AA between the bit line BL and the source line SL, and a memory string having the selection transistors ST connected on both sides of the memory transistors is formed.

The portion 6 and the portion 7 are disposed contiguously in the Y direction in each active area AA, and the n+-type diffusion layers 28 are formed continuously, hence two selection transistors ST disposed on the same active area AA and included in mutually different memory strings MS are electrically connected. Thereby, one bit line contact CB can be shared with two memory strings MS. A memory cell array is formed from the plurality of memory strings MS.

Next, a method for manufacturing the nonvolatile semiconductor memory device according to this embodiment is described.

FIG. 11A to FIG. 24C are views illustrating the manufacturing method of the nonvolatile semiconductor memory device according to this embodiment. FIGS. A are sequential plan views of, FIGS. B are sequential cross-sectional views along B-B' line shown in FIGS. A, and FIGS. C are sequential cross-sectional views along C-C' line shown in FIGS. A.

This embodiment has a feature in the bit line contact region Rbc, and hence FIG. 11A to FIG. 24C show only the bit line contact region Rbc and part of the memory string regions Rms adjacent to the region Rbc.

Figure 11A:
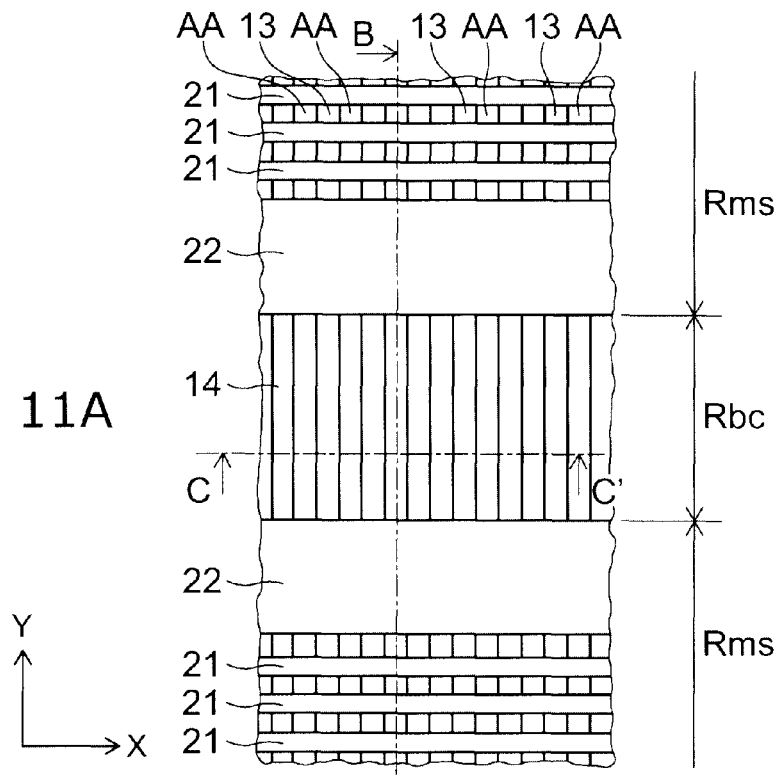
FIGS. 11A to 24C are views illustrating a manufacturing method of the nonvolatile semiconductor memory device according to the fifth embodiment.
Figure 11B:
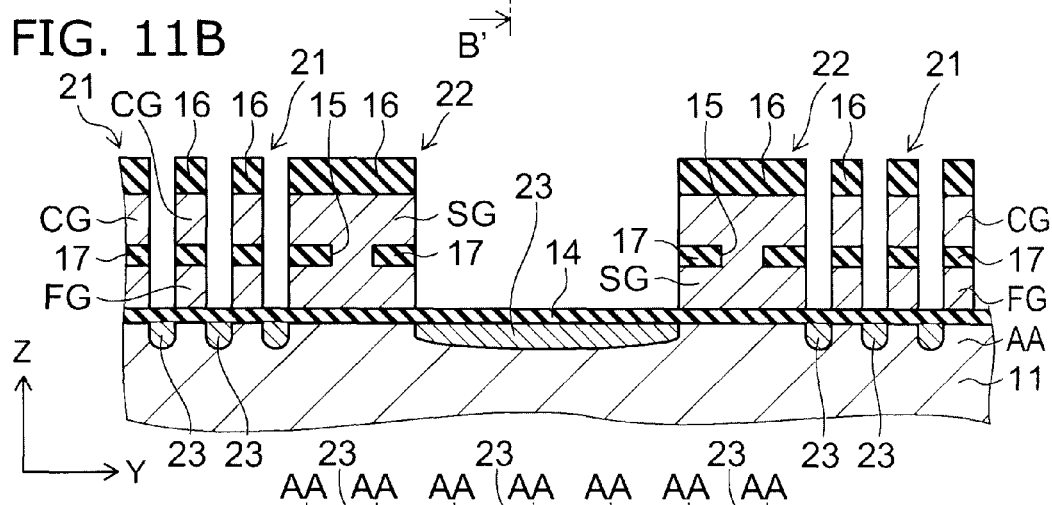
Figure 11C:
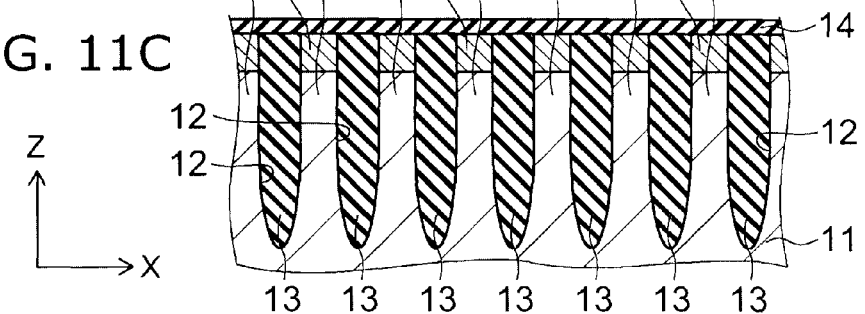

As shown in FIGS. 11A to 11C, the silicon substrate 11 is prepared. For example, the silicon substrate 11 is part of a p-type silicon wafer. A plurality of memory string regions Rms are configured mutually isolated along the Y direction. Regions between the plurality of memory string regions Rms form alternately the bit line contact region Rbc or the source line contact region Rsc (see FIG. 7).

The n-type well (not shown) is formed in the silicon substrate 11. Next, the p-type well (not shown) is formed in the upper portion of the n-type well. The memory string regions Rms, the bit line contact region Rbc and the source line contact region Rsc described above are disposed inside one p-type well. Next, silicon oxide is illustratively deposited to form the tunneling insulating film 14. Although the tunneling insulating film 14 is normally insulating, a current is flown on application of a prescribed voltage within a range of a drive voltage of the device 5. Next, a conductive material, for example, a poly-silicon film containing an impurity is deposited on the tunneling insulating film 14. After that, the poly-silicon film, the tunneling insulating film 14 and the silicon substrate 11 are selectively etched to form a plurality of line shaped trenches 12 extending in the Y direction. Each trench is formed so as to pass through the plurality of memory string regions Rms and the bit line contact region Rbc and the source line contact region Rsc therebetween.

Next, silicon oxide is buried into the inner of the trenches 12 to form the element isolation insulators 13. Portions between the element isolation insulators 13 in the upper portion of the silicon substrate 11 serve as the active areas AA. That is, the upper portion of the silicon substrate 11 is divided into the plurality of active areas AA mutually separated, and the active areas AA are made of p-type single crystalline silicon and extend in the Y direction. At this time, the floating gate electrodes FG are formed immediately above the active areas AA in the memory string regions Rms.

The insulating films 17 illustratively made of an ONO film are deposited to cover the floating gate electrodes FG. After that, the openings 15 are formed in regions where the selection gate electrodes SG (see FIG. 10) are to be formed in the insulating films 17. Next, the poly-silicon film and the silicon nitride film are stacked in this order. Then, the poly-silicon film deposited later is buried into the openings 15 and is in contact with the poly-silicon film deposited earlier. Next, the silicon nitride film is processed into a plurality of lines extending in the Y direction by a lithography technique to serve as stopper films 16. After that, dry etching is performed using the stopper films 16 as a mask, and the poly-silicon film and the silicon oxide film described above are patterned.

Thereby, the plurality of stacked units 21 are formed on the tunneling insulating film 14 in regions other than both end portions in the Y direction of the memory string regions Rms. In the stacked units 21, the floating gate electrodes FG made of poly-silicon and divided along the X direction are buried by the insulating films 17, and the control gate electrodes CG made of poly-silicon and the stopper films 16 are provided on/above the insulating films 17. Each of the stacked units 21 extends in the X direction across the plurality of active areas AA. The pair of stacked units 22 are formed on both end portions in the Y direction of the memory string portions Rms, namely, on both sides of the set including the plurality of stacked units 21 arranged along the Y direction. The basic structure of the stacked units 22 is the same as that of the stacked units 21, however the poly-silicon films forming the floating gate electrodes FG are connected to the poly-silicon films forming the control gate electrodes CG via the openings 15, and the whole of the electrodes forms the selection gate electrodes SG. A width of the stacked units 22 is larger than a width of the stacked units 21. Furthermore, the floating gate electrodes FG, the insulating films 17, the control gate electrodes CG and the stopper films 16 are removed by etching in the bit contact region Rbc.

Next, the impurity illustratively made of arsenic (As) or the like is ion-implanted into the silicon substrate 11 using the stacked units 21 and 22 as a mask. This forms the n-type diffusion layers 23 in regions excluding regions immediately below the stacked units 21 and 22 in the uppermost portion of the silicon substrate 11.

Figure 12A:
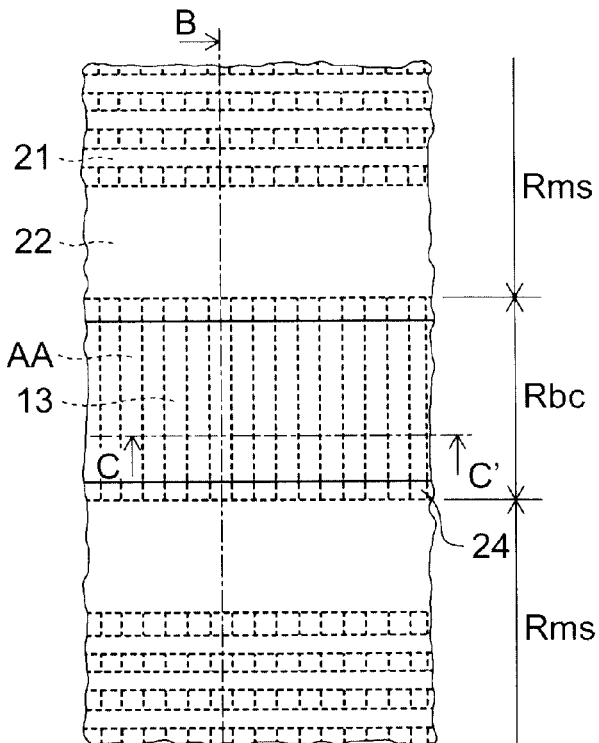
Figure 12B:
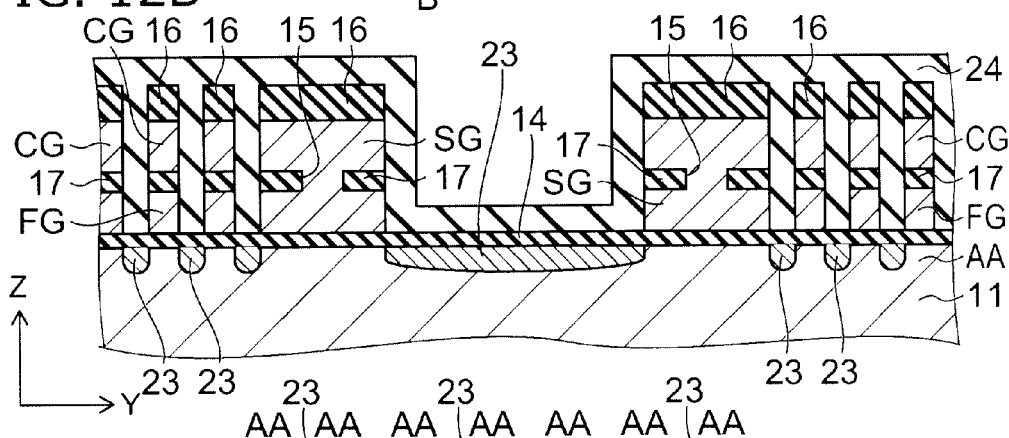
Figure 12C:
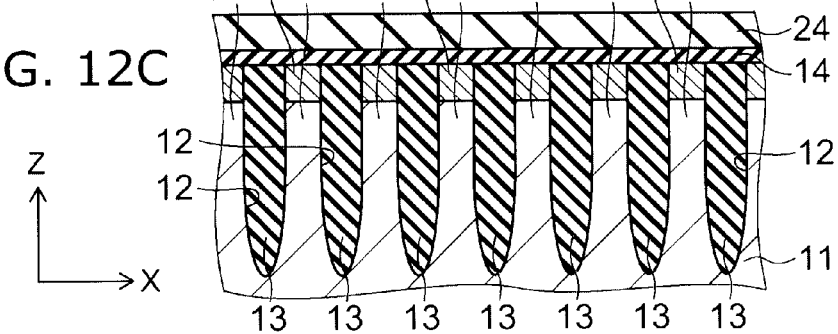

As shown in FIGS. 12A to 12C, a silicon oxide film 24 is formed by deposition of insulating material, for example, silicon oxide over the whole surface. The silicon oxide film 24 is buried between the stacked units 21 and between the stacked units 21 and the stacked units 22 in the memory string regions Rms, and is also formed on side faces of the bit line contact region Rbc side and the source line contact region Rsc side of the stacked units 22. The silicon oxide film 24 is formed on the tunneling insulating film 14 in the bit line contact region Rbc and the source line contact region Rsc.

Figure 13A:
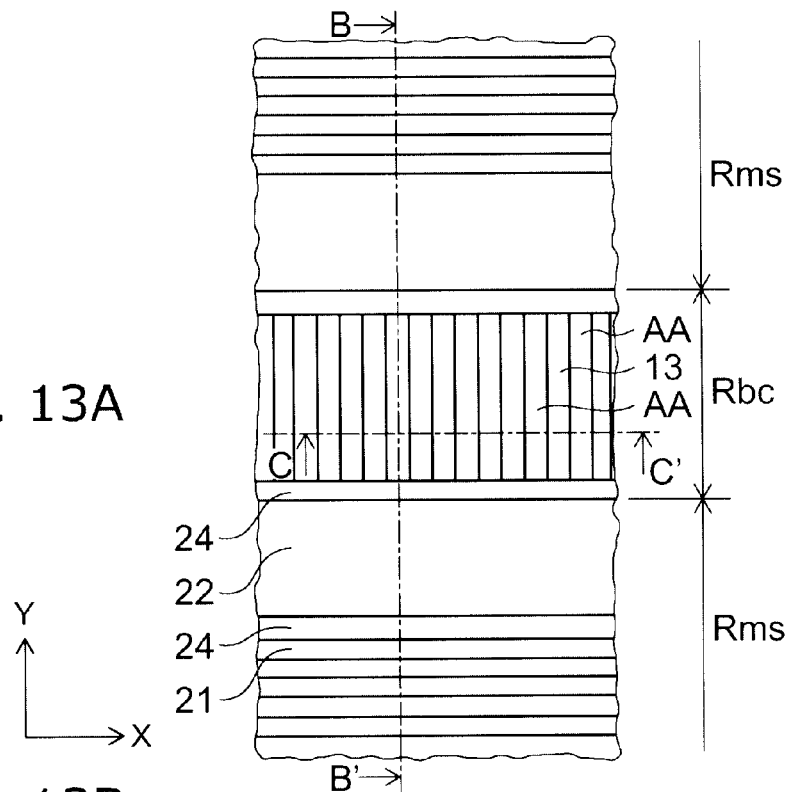
Figure 13B:
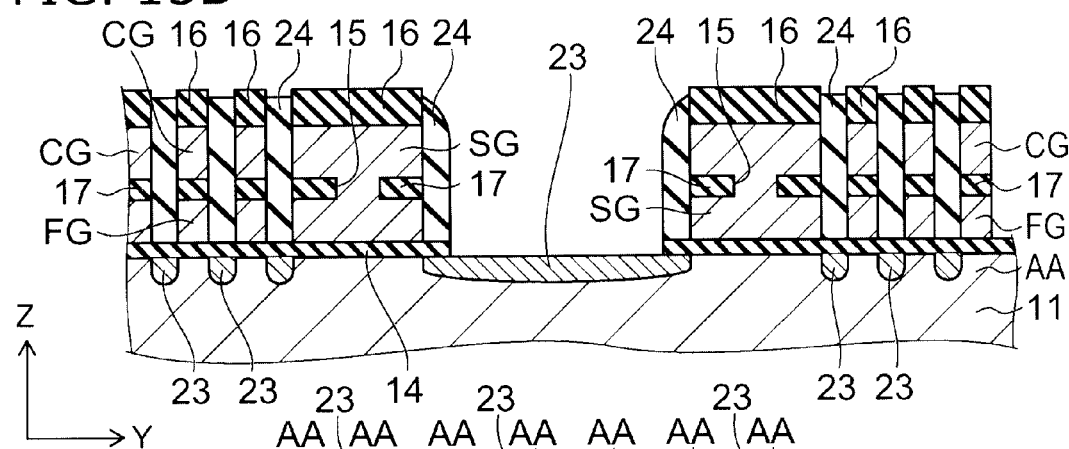
Figure 13C:
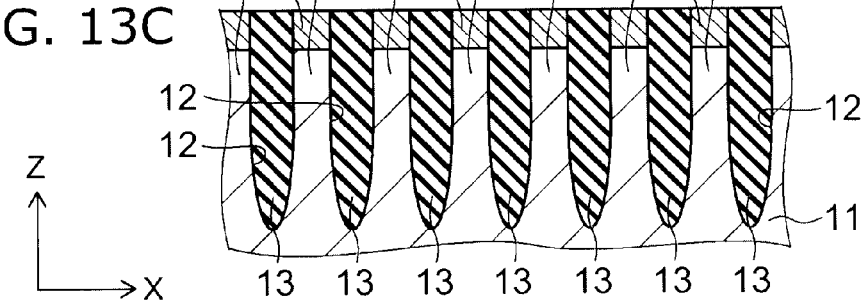

As shown in FIGS. 13A to 13C, anisotropic etching, for example, RIE (reactive ion etching) is performed. This removes the silicon oxide film 24 from the upper surfaces of the stacked units 21 and 22 in the memory string regions Rms. The silicon oxide film 24 and the tunneling insulating film 14 are removed from over the silicon substrate 11 in the bit line contact region Rbc and the source line contact region Rsc, and the active areas AA and the element isolation insulators 13 are exposed.

Figure 14A:
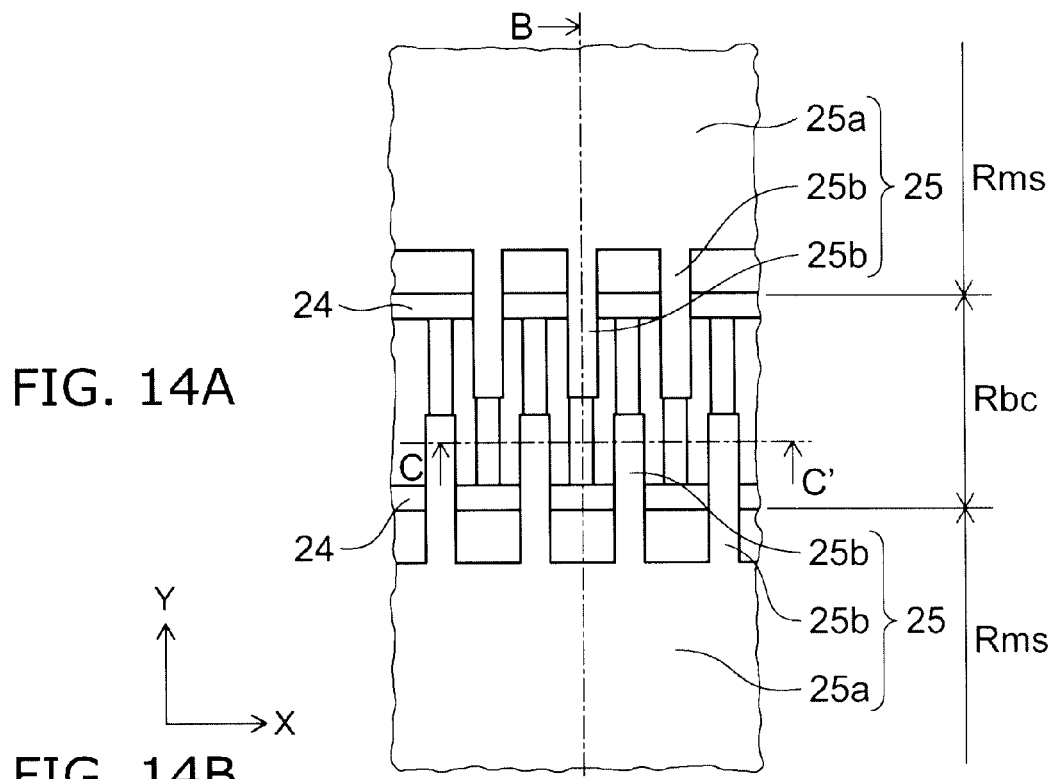
Figure 14B:
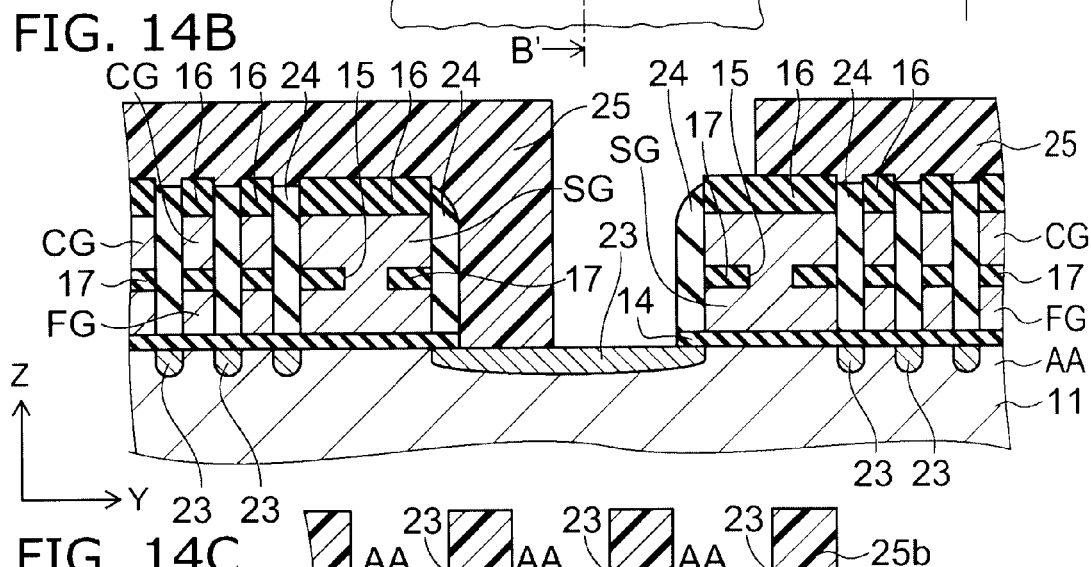
Figure 14C:
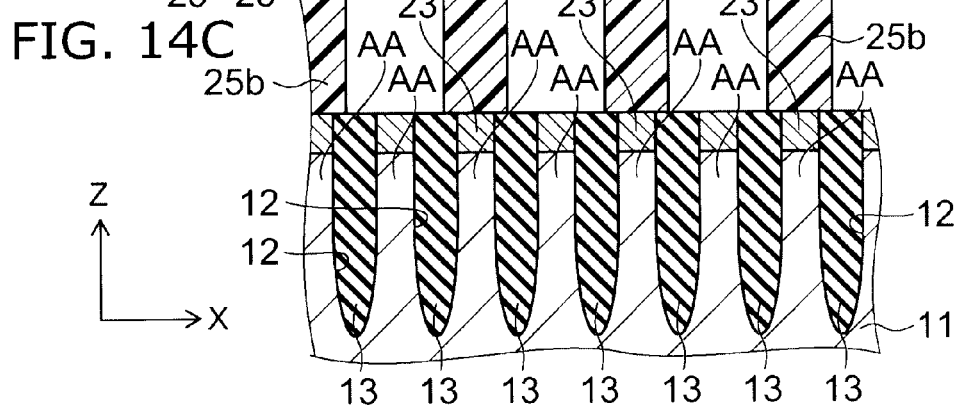

As shown in FIGS. 14A to 14C, a resist mask 25 is formed so as to cover part of the silicon substrate 11, the stacked units 21 and 22. The resist mask 25 includes a main portion 25a and a plurality of protruding portions 25b protruding from the main portion 25a in the Y direction. The main portion 25a is formed so as to cover the whole of the source contact region Rsc and portions excluding end portions on the bit line contact region Rbc side of the stacked units 22 in the memory string regions Rms. The protruding portions 25b are formed to cover regions to be the portions 6 of the active areas AA in the bit line contact region Rbc. At this time, portions on the bit line contact region Rbc side of the stacked units 22, the element isolation insulators 13 and portions to be the portions 7 of the active areas AA are not covered with the resist mask 25 to be exposed.

Figure 15A:
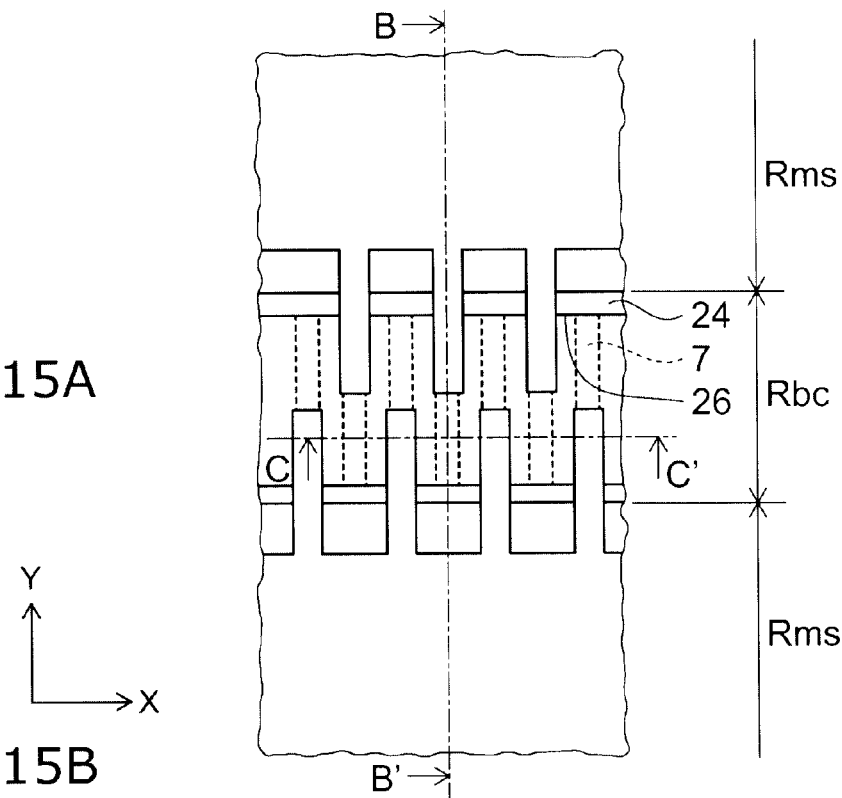
Figure 15B:
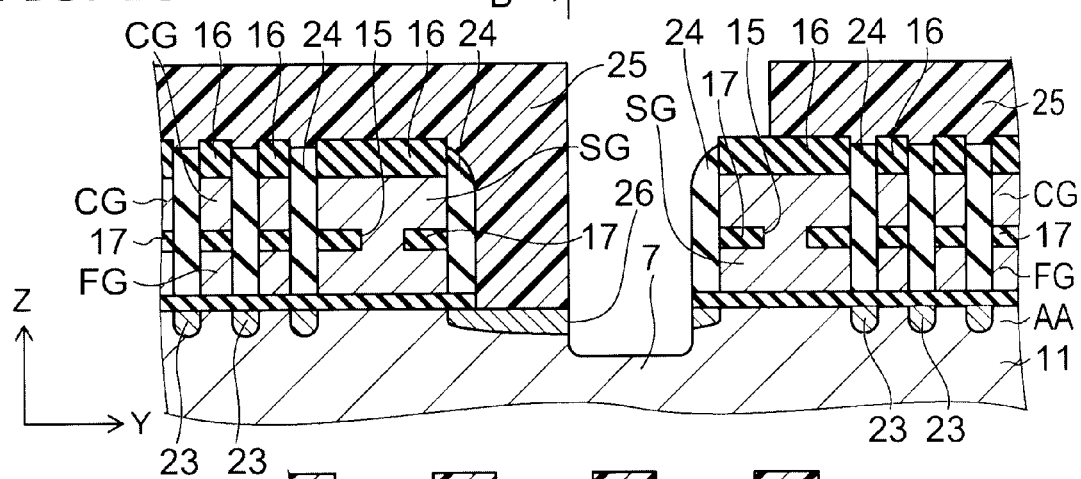
Figure 15C:
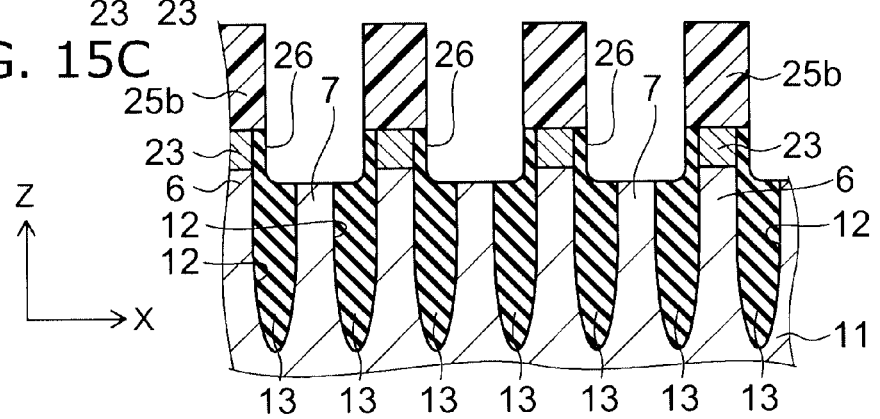

As shown in FIGS. 15A to 15C, anisotropic etching, for example, RIE is illustratively performed. The portions not covered with the resist mask 25, the stacked units 22 and the silicon oxide film 24 in the active areas AA and element isolation insulators 13 is engraved. As a result, recess portions 26 are formed in the upper surface of the silicon substrate 11. Portions corresponding to bottoms of the recess portions 26 serve as the portions 7. The engraved amount of the recess portions 26 is illustratively taken as 100 nm or less, for example, 500 nm or less, in case a depth of the trenches 12 is 200 nm.

Figure 16A:
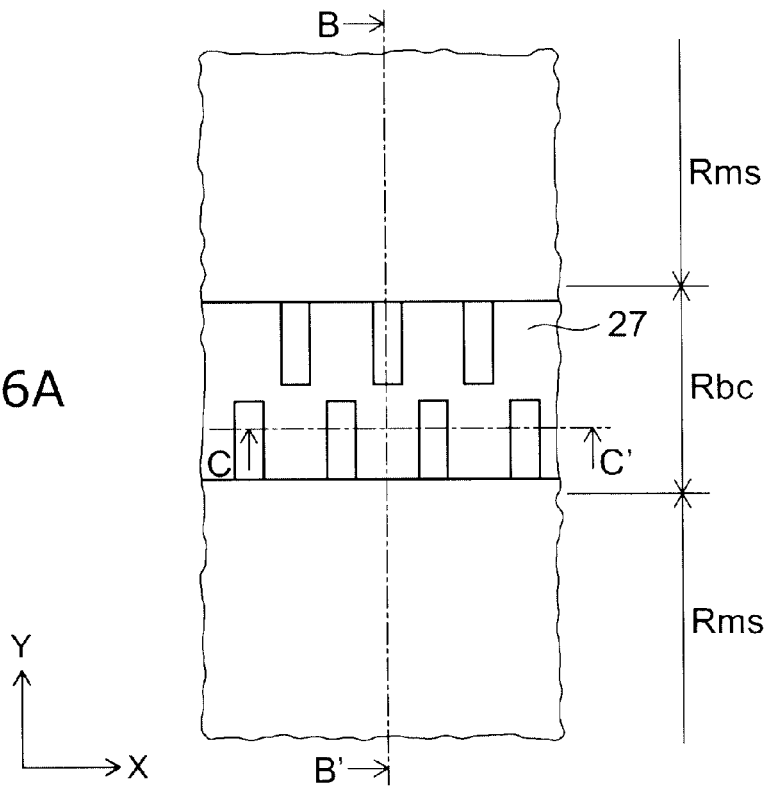
Figure 16B:
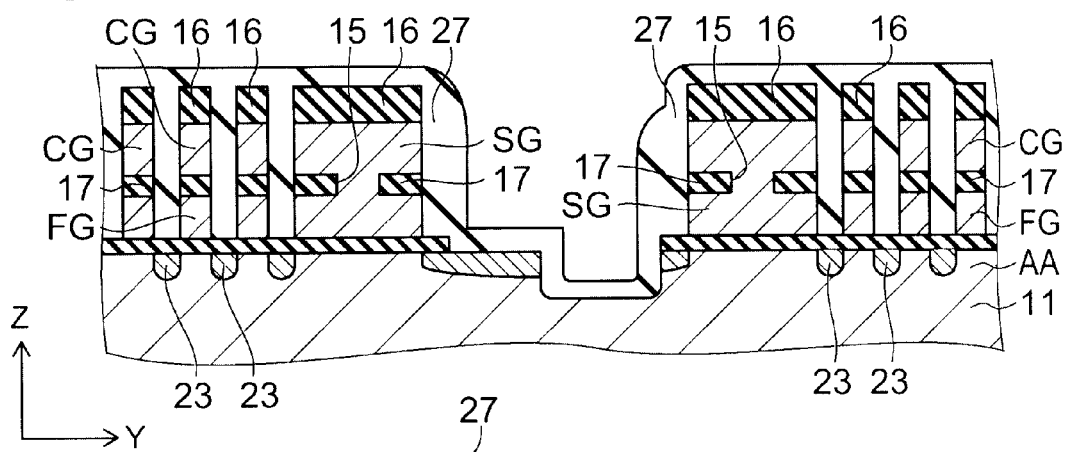
Figure 16C:
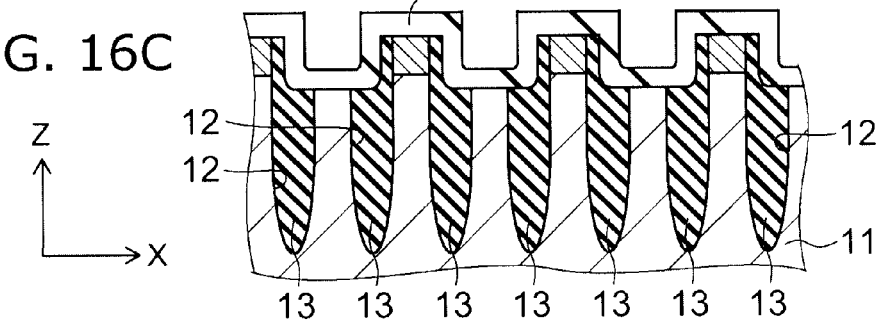

As shown in FIGS. 16A to 16C, the silicon oxide is deposited on the whole surface after removal of the resist mask 25. This silicon oxide is unified with the silicon oxide film 24 remained in the memory string regions Rms to form a silicon oxide film 27. The silicon oxide film 27 is formed in order to protect the exposed silicon substrate 11 in the bit line contact region Rbc.

Figure 17A:
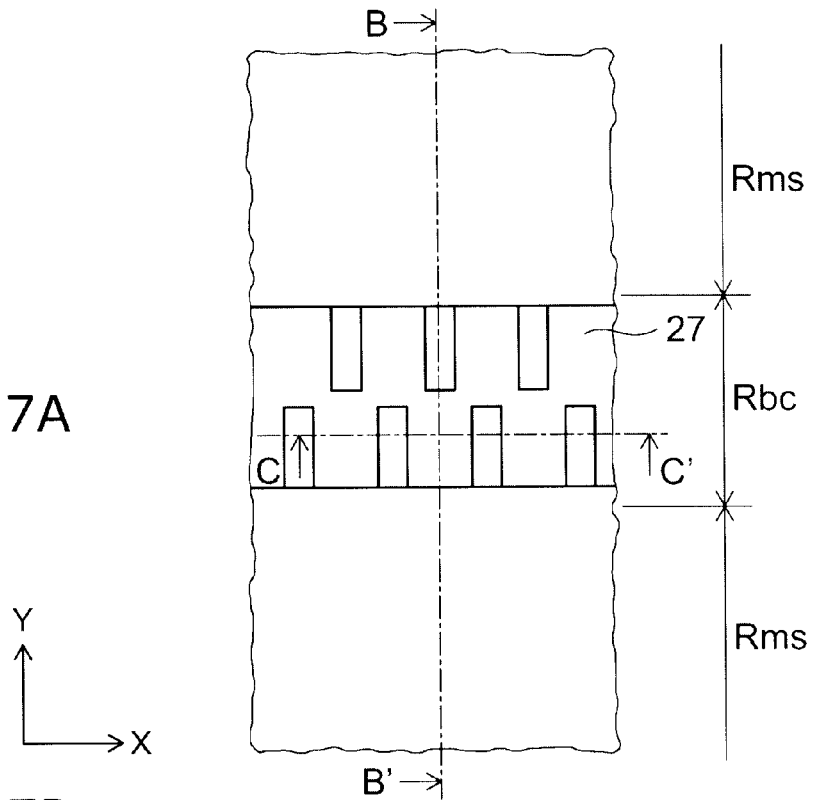
Figure 17B:
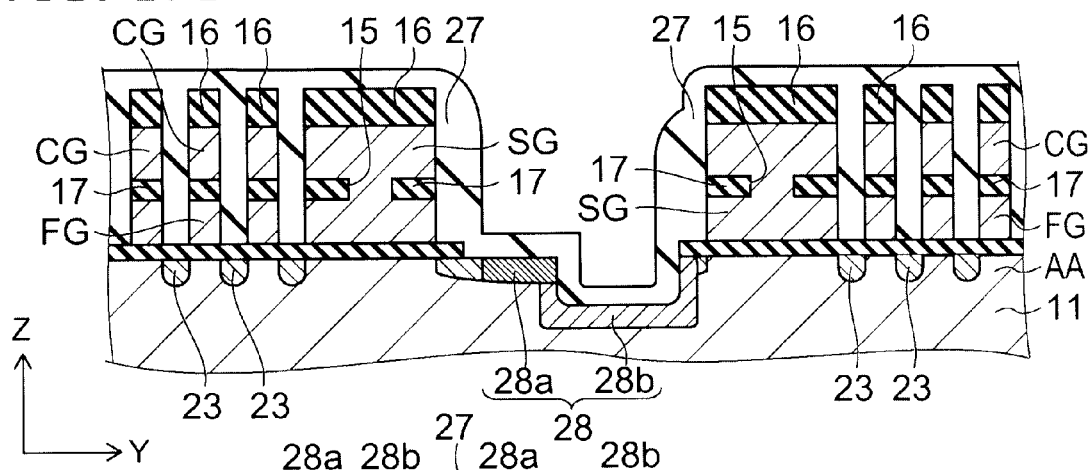
Figure 17C:
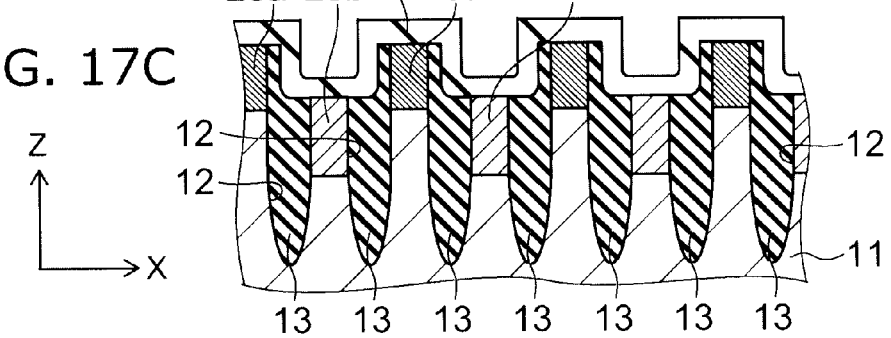

As shown in FIGS. 17A to 17C, arsenic (As) is ion-implanted through the silicon oxide film 27. The $n^+$-type diffusion layers 28 is formed in the uppermost region of the active areas AA in the bit line contact region Rbc and the source line contact region Rsc. Here, the n-type diffusion layers 23 and the $n^+$-type diffusion layers 28 are doubly implanted with arsenic in the portions 6. On the other hand, the only $n^+$-type diffusion layers 28 are implanted with arsenic in the portions 7. As a result, the impurity concentration in the portions 28b formed in the portions 7 is lower than the impurity concentration in the portions 28a formed in the portions 6. At this point, an n-type impurity concentration in the portions 28a formed in the portions 6 may add an n-type impurity concentration in the portions 28b formed in the portions 7 and an n-type impurity concentration in the n-type diffusion layers 23.

Figure 18A:
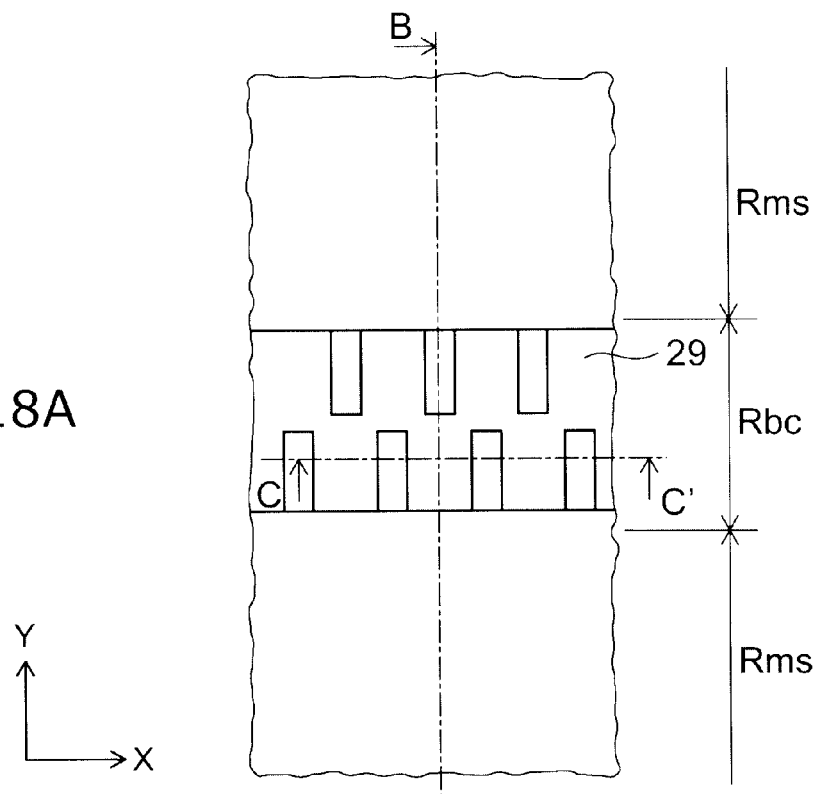
Figure 18B:
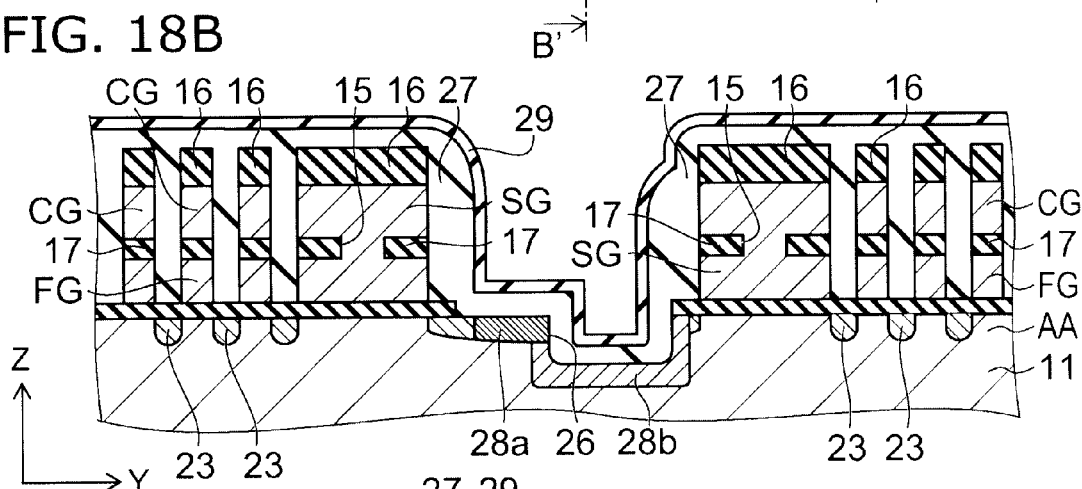
Figure 18C:
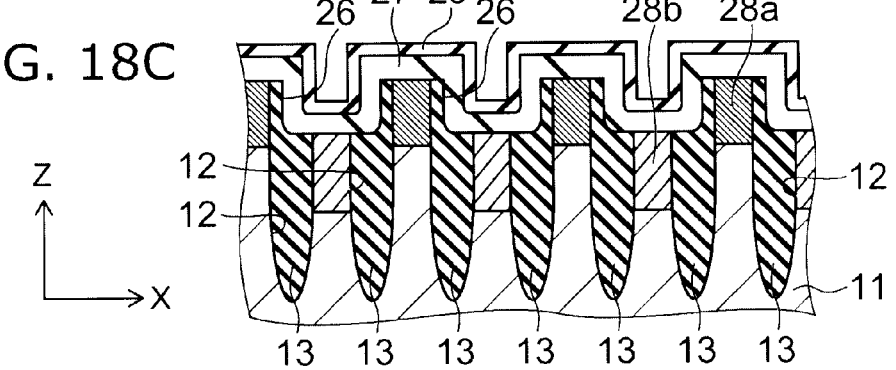

As shown in FIGS. 18A to 18C, a silicon nitride film 29 is formed on the whole surface. The silicon nitride film 29 prevents diffusion of the impurity and functions as a stopper when CMP (chemical mechanical polishing) is performed in a later process. The portion formed in the memory string regions of the silicon nitride film 29 is approximately flat so as to cover the stacked units 21 and 22, and the portion formed in the bit line contact region Rbc and the source line contact region Rsc is recessed relative to the portion formed in the memory string regions Rms. The portion covering the recesses 26 in the bit line contact region Rbc of the silicon nitride film 29 is recessed reflecting the shape of the recesses 26.

Figure 19A:
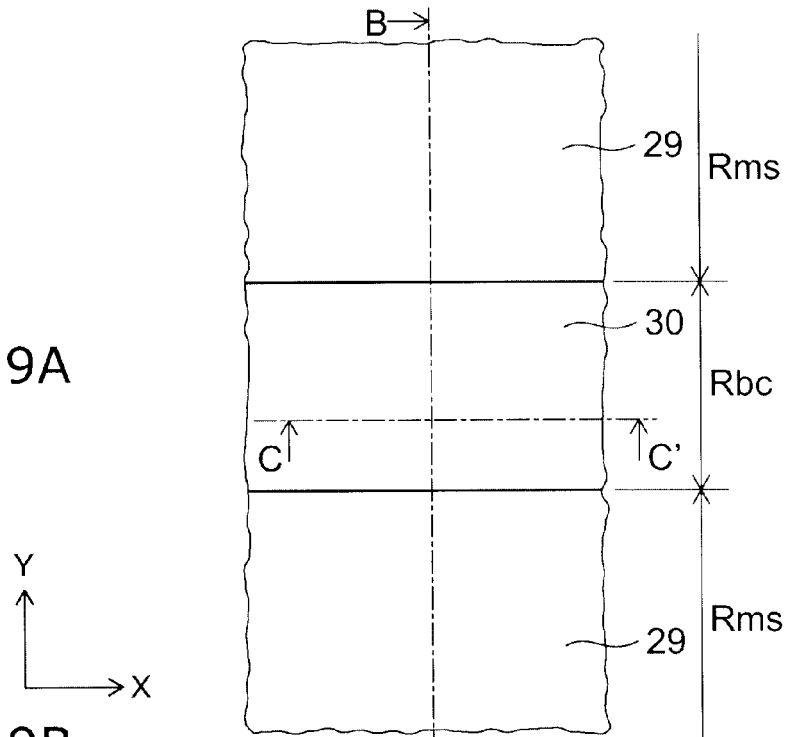
Figure 19B:
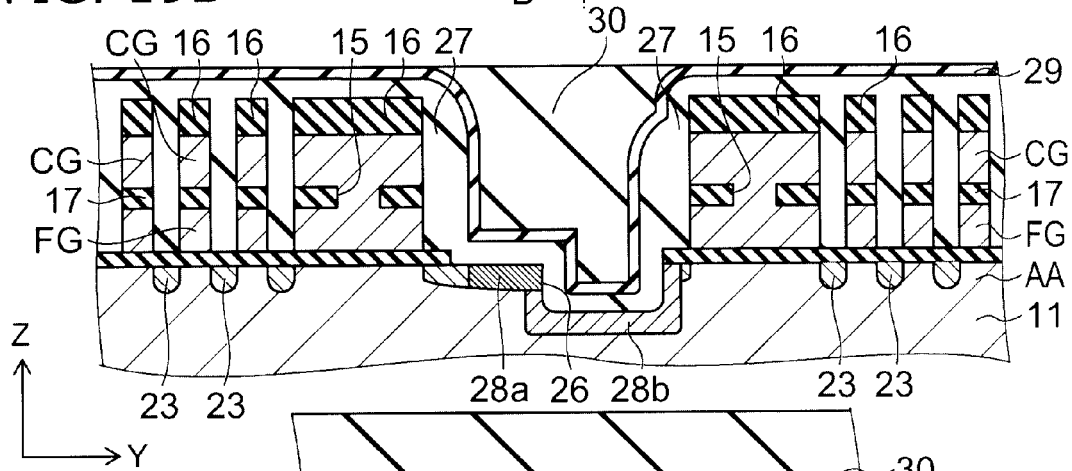
Figure 19C:
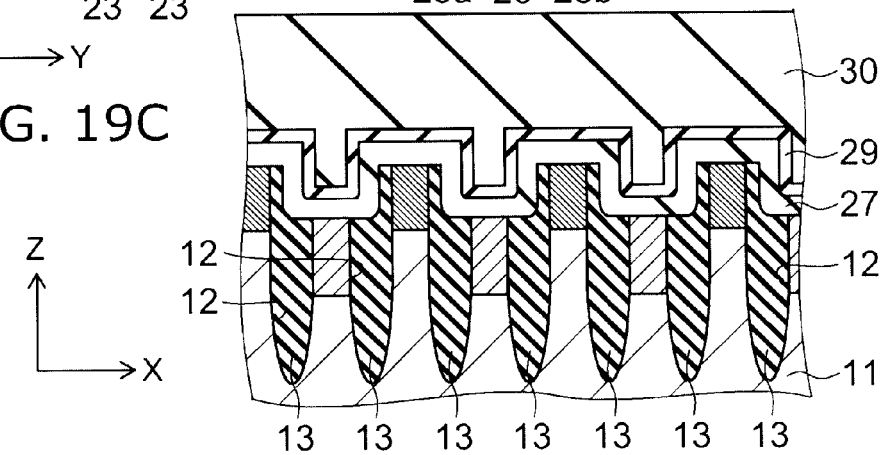

As shown in FIGS. 19A to 19C, insulating material such as silicon oxide or the like is illustratively deposited on the whole surface. After that, CMP is performed using the silicon nitride film 29 a stopper to remove the insulating material deposited on the silicon nitride film 29 in the memory string regions Rms. Thereby, an inter-layer insulating member 30 is buried into the bit line contact region Rbc and the source line contact region Rsc.

Figure 20A:
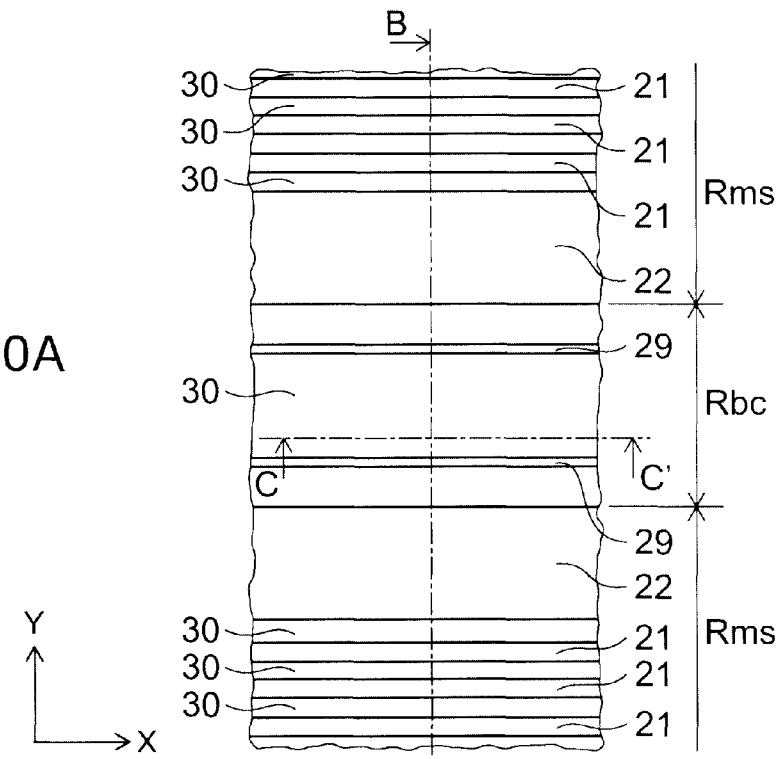
Figure 20B:
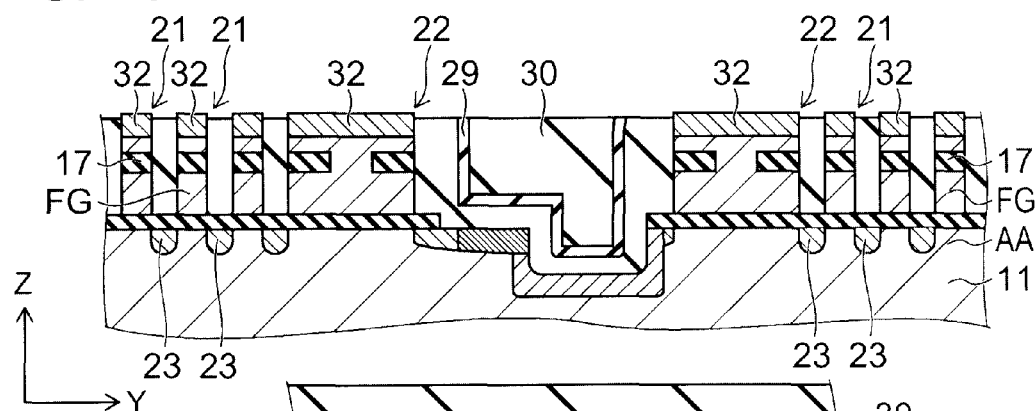
Figure 20C:
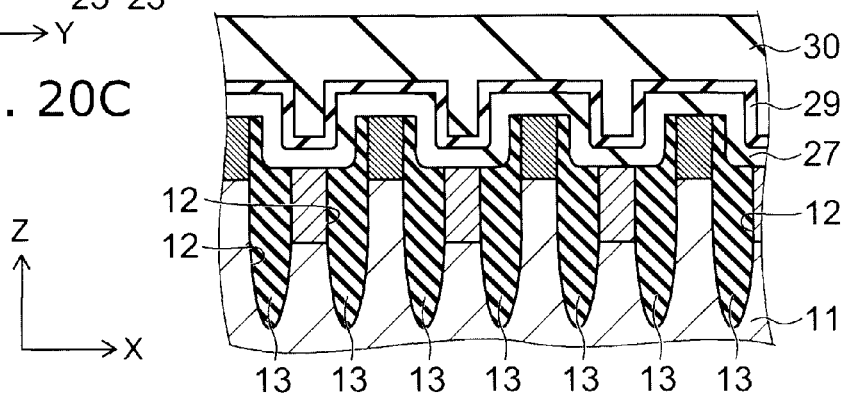

As shown in FIGS. 20A to 20 C, etching is performed on the whole surface. This etching is performed until the upper surfaces of the control gate electrodes CG of the stacked units 21 and the selection gate electrodes SG of the stacked units 22 are exposed. This removes the portions placed above the upper surfaces of the stacked units 21 and 22 out of the inter-layer insulating member 30, the silicon nitride film 29 and the silicon oxide film 27. Next, a silicidation treatment is performed and the silicide layer 32 is formed in the upper portions of the control gate electrodes CG and the upper portions of the selection gate electrodes SG. The silicide layer 32 is illustratively formed of cobalt silicide or tungsten silicide.

Figure 21A:
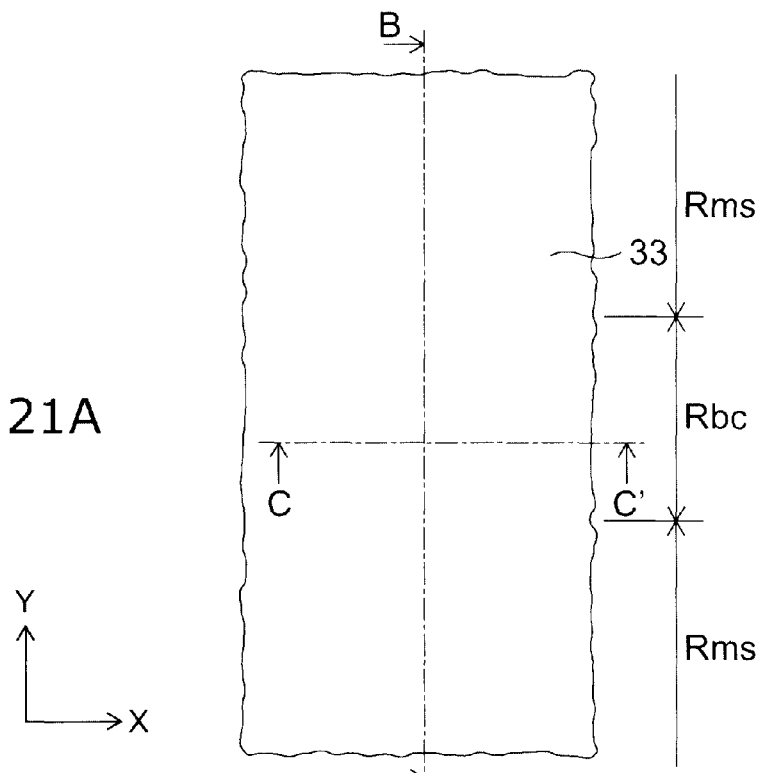
Figure 21B:
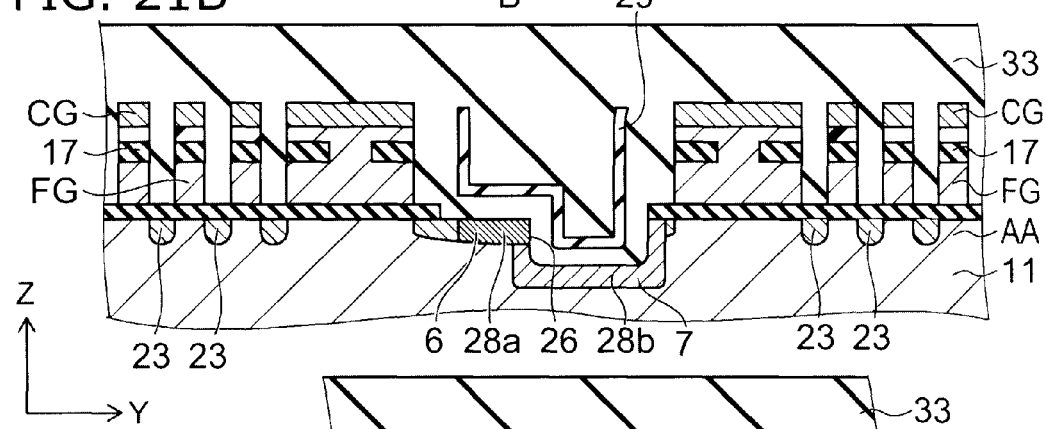
Figure 21C:
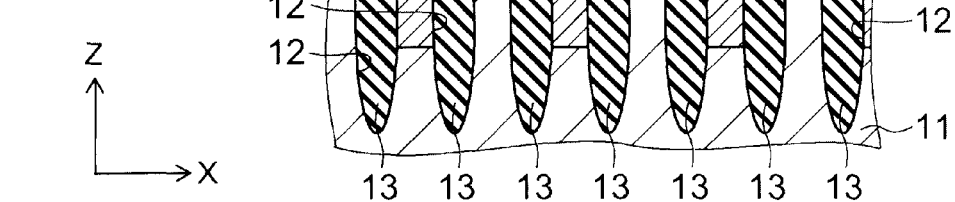

As shown in FIGS. 21A to 21C, insulating material such as silicon oxide or the like is illustratively deposited on the whole surface. This insulating material is unified with the silicon oxide film 27 and the inter-layer insulating member 30 to form the inter-layer insulating film 33. Here, part of the silicon nitride film 29 remains in the inter-layer insulating film 33, however is omitted in FIG. 8 and FIG. 9.

Figure 22A:
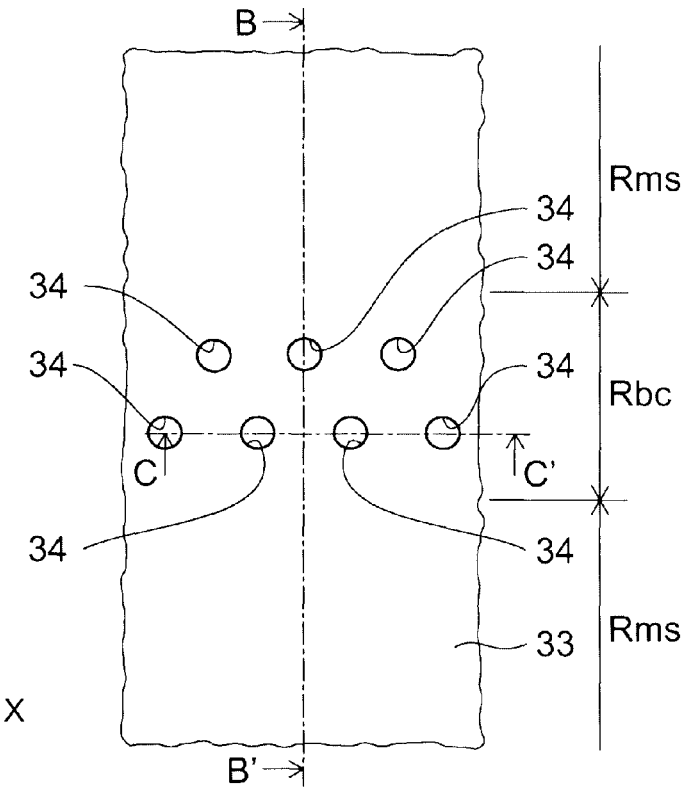
Figure 22B:
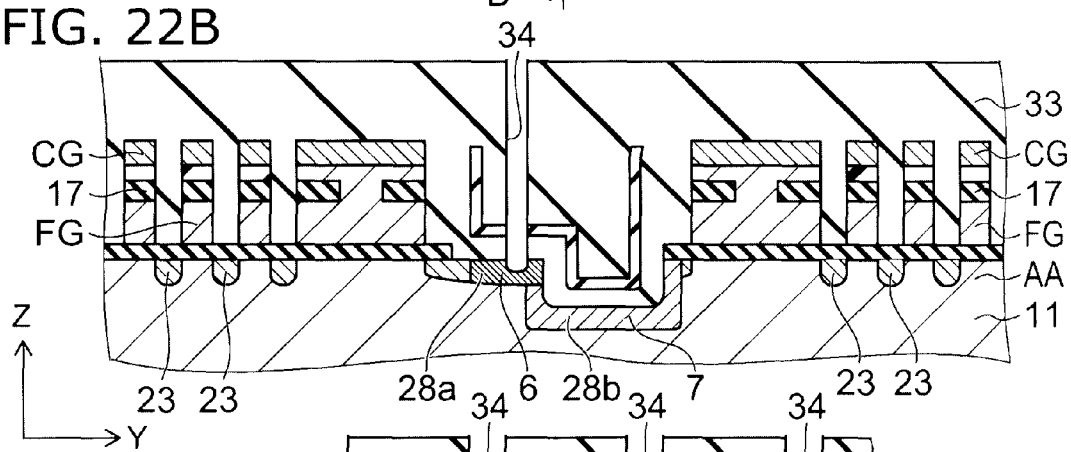
Figure 22C:
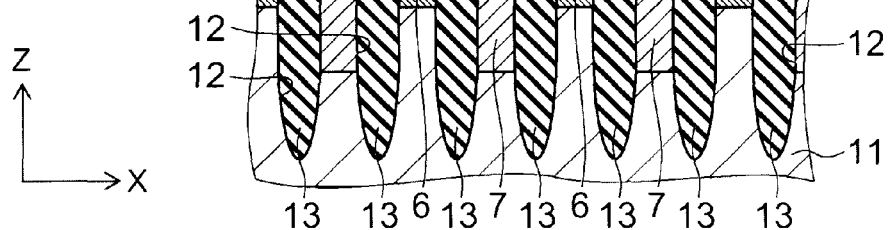

As shown in FIGS. 22A to 22C, a plurality of contact holes 34 are formed in the inter-layer insulating film 33. The contact holes 34 are formed in a zigzag alignment immediately above the portions 6 in the active areas AA to reach the portions 6. Similar contact holes are also formed in the source line contact region Rsc.

Figure 23A:
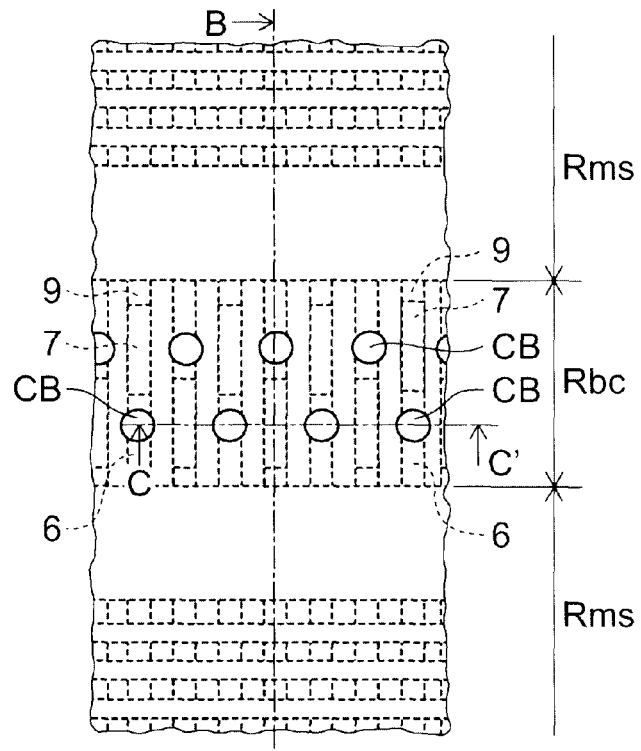
Figure 23B:
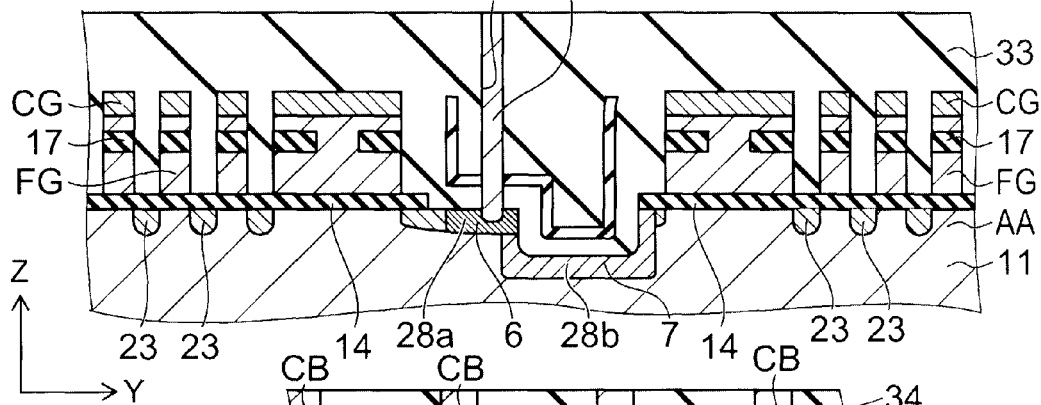
Figure 23C:
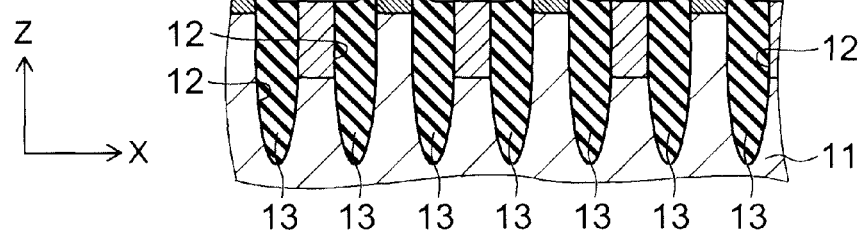

As shown in FIGS. 23A to 23C, a plug material, for example, tungsten is buried into the contact holes 34 to form the bit line contacts CB. Similarly, tungsten is also buried into the contact holes in the source line contact region Rsc to form the source line contacts. After that, respective source line contacts are commonly electrically connected with the source line by formation of the source line.

Figure 24A:
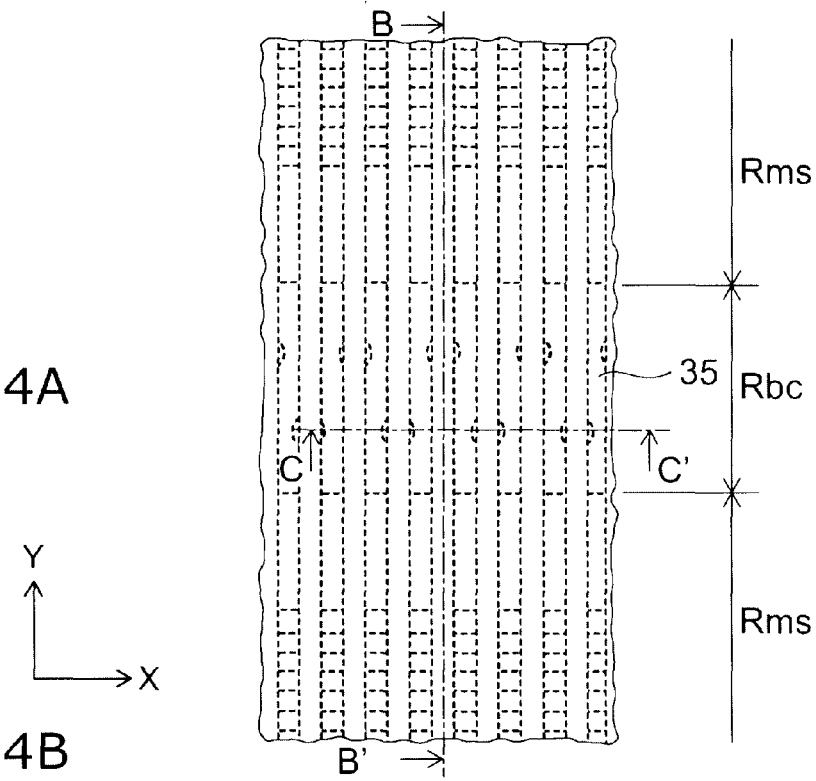
Figure 24B:
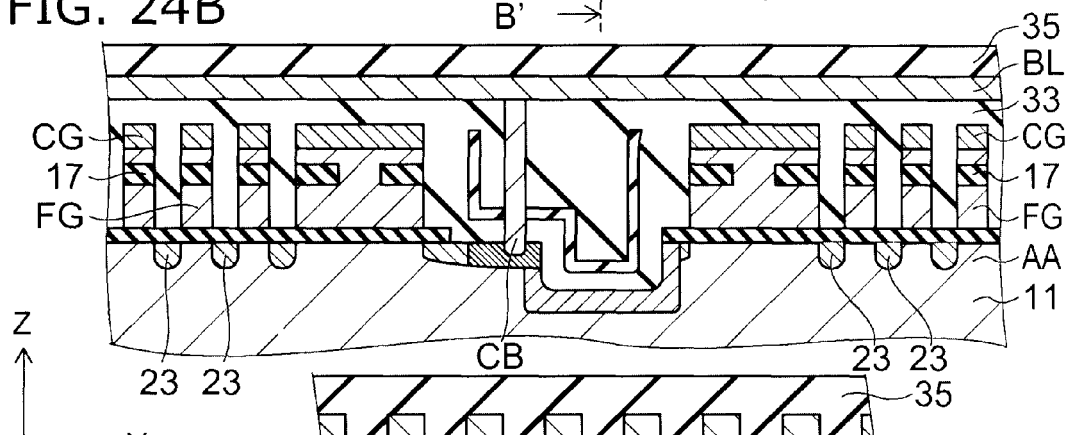
Figure 24C:
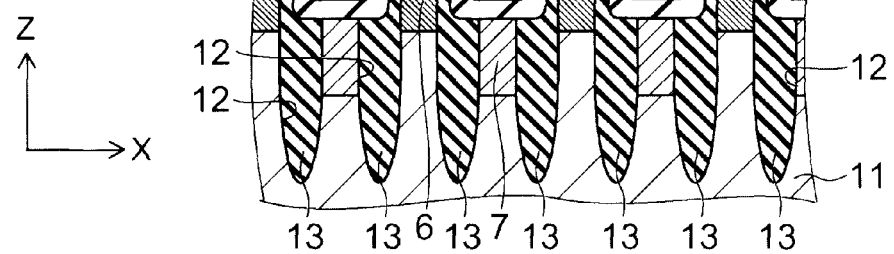

As shown in FIGS. 24A to 24C, the plurality of bit lines BL are formed on the inter-layer insulating film 33. The bit lines BL are formed so as to extend in the Y direction immediately above the active areas AA and are connected to the bit line contacts CB. Next, insulating material such as silicon oxide or the like is deposited to bury the bit lines BL above the inter-layer insulating film 33 and an inter-layer insulating film 35 is formed. After that, the silicon wafer is diced into the silicon substrates 11. In this way, the nonvolatile semiconductor device 5 according to this embodiment is manufactured.

In this embodiment as well, a shortest distance between the active areas AA and the bit line contacts CB can be elongated by engraving the portions 7 of the active areas AA in the bit line contact region Rbc similar to the first embodiment described above. This allows to ensure a short circuit margin between the bit line contacts CB and the active areas AA without thinning the bit line contacts CB, even if arranged periodically of the active areas AA is shortened. A diameter of the bit line contacts CB can be enlarged, and hence a contact resistance between the bit line contacts CB and the active areas AA can be reduced. Furthermore, alignment margin in a lithography process can be ensured and reduction of the diameter of the bit line contacts CB can be suppressed, and hence processing difficulty can be reduced. As a result, the yield of the device 5 is improved.

In this embodiment, in processes shown in FIGS. 17A to 17C, the n-type diffusion layers 23 and the $n^+$-type diffusion layers 28 are doubly formed with respect to the portions 6 and the only $n^+$-type diffusion layers 28 are formed with respect to the portions 7. This allows a contact resistance between the bit line contacts CB and the portions 6 to be reduced and can prevent voltage modulation of the bit lines BL during programming operation.

For example, it is supposed that a potential of 3 V is applied to the bit line contacts CB in a memory unit NU1 shown in FIG. 10 and a potential of 0V is applied to the bit line contacts CB in a memory unit NU2 on a plurality of memory units, each of the units including one memory string MS. A distance from the bottom of the $n^+$-type diffusion layers 28 to the bottom of the element isolation insulators 13 in the portion 7 is shorter than a distance in the portions 6. Therefore, if the impurity concentration of the impurity diffusion layers in the portions 6 is the same as that in the portions 7, depletion layers becomes easy to be connected between the memory unit 1 and the portions 7 of the memory unit 2, and voltage modulation occurs between the bit lines BL connected to the memory unit 1 and the bit lines BL connected to the memory unit 2.

Consequently, in this embodiment, the impurity concentration of the impurity diffusion layers in the portions 7 is set to be lower than the impurity concentration of the impurity diffusion layers in the portions 6. This can reduce the depth of the depletion layers formed on the silicon substrate side from the interface between the $n^+$-type diffusion layers 28 and the silicon substrate 11 in the portions 6. That is, the distance from the bottom of the depletion layers to the bottom of the element isolation insulators 13 is lengthened, hence the depletion layers can be prevented from being connected between the memory unit NU1 and the memory unit NU2. In this way, voltage modulation of the bit lines BL during programming operation can be prevented, while reducing the contact resistance between the bit line contacts CB and the portions 6.

The invention has been described with reference to the embodiments. However, the invention is not limited to these embodiments. The above respective embodiments can be practiced in combination with each other. Furthermore, any addition, deletion, or design change of components, or any addition, omission, or condition change of processes in the above embodiments suitably made by those skilled in the art are also encompassed within the scope of the invention as long as they fall within the spirit of the invention. For example, the floating gate electrode-type memory device with the charge storage member made of conductive material is illustrated, however the invention is not limited thereto. The charge trap-type memory device with the charge storage member made of insulating material, for example, the memory device of the MONOS (metal-oxide-nitride-oxide-silicon) type may be practiced.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modification as would fall within the scope and spirit of the inventions.

According to these embodiments, the short-circuit margin between the bit line contact and the active area can be ensured without thinning the bit line contact in a nonvolatile semiconductor memory device.

The invention claimed is:

1. A nonvolatile semiconductor memory device comprising:
    a semiconductor substrate;
    an element isolation insulator formed in an upper portion of the semiconductor substrate and dividing the upper portion into a first active area extending in a first direction and a second active area extending in the first direction;
    a first contact provided above the first active area and having a lower end portion connected to the first active area; and
    a second contact provided above the second active area and having a lower end portion connected to the second active area,
    each of the first active area and the second active area including:

a first portion connected to one of the first contact and the second contact; and
a second portion having an upper surface being placed lower than an upper surface of the first portion,
wherein the first contact and the second contact are mutually shifted in the first direction,
the first portion of the first active area and the second portion of the second active area are disposed at a same position in the first direction and are adjacent to and separated from each other in a direction perpendicular to the first direction.

2. The device according to claim 1, wherein
a curvature radius of an edge portion between the upper surface of the second portion and a side surface of the second portion is larger than a curvature radius of an edge portion between the upper surface of the first portion and a side surface of the first portion.

3. The device according to claim 1, further comprising:
a first impurity diffusion layer formed in an upper portion of the first active area and having a conductivity type different from the conductivity type of the first active area; and
a second impurity diffusion layer formed in an upper portion of the second active areas and having a conductivity type different from the conductivity type of the second active area,
the first portion and the second portion being disposed to be mutually in contact with along the first direction in the first and second active areas, the first and second impurity diffusion layers being formed continuously to the first portion and the second portion.

4. The device according to claim 3, wherein
an impurity concentration in a portion formed in the second portion of the first and the second impurity diffusion layers is lower than an impurity concentration in a portion formed in the first portion of the first and second impurity diffusion layers.

5. The device according to claim 1, further comprising:
another element isolation insulator formed in the upper portion of the semiconductor substrate and dividing the upper portion into the first active area and a third active area extending in the first direction; and
a third contact provided above the third active area and having a lower end portion connected to the third active area,
the third active area including:
a first portion connected to the third contact; and
a second portion having an upper surface being placed lower than an upper surface of the first portion,
the second portion of the second active area and the second portion of the third active area being disposed on both sides of the first portion of the first active area in a direction perpendicular to the first direction.

6. The device according to claim 1, further comprising:
another element isolation insulator formed in the upper portion of the semiconductor substrate and dividing the upper portion into the first active area and a third active area extending in the first direction; and
a third contact provided above the third active area and having a lower end portion connected to the third active area,
the third active area including:
a first portion connected to the third contact; and
a second portion having an upper surface being placed lower than an upper surface of the first portion,
the second portion of the second active area and the second portion of the third active area being disposed on both sides of a region being in contact with the first contact of the first active area in a direction perpendicular to the first direction.

7. The device according to claim 1, wherein
the first and second contacts are column-shaped and lower end portions of the first and second contacts are thinner than other portions.

8. The device according to claim 1, wherein
a central axis of the first contact is shifted from a central axis of the first active area, and
a central axis of the second contact is shifted from a central axis of the second active area.

9. The device according to claim 1, wherein
the first portion extends from a region immediately below the first and second contacts to both sides in the first direction.

10. The device according to claim 1, wherein
the first and second contacts are arranged in a zigzag alignment as viewed from above.

11. The device according to claim 1, further comprising:
another element isolation insulator formed in the upper portion of the semiconductor substrate and dividing the upper portion into the first active area and a third active area extending in the first direction; and
a third contact provided above the third active area and having a lower end portion connected to the third active area,
the third active area including:
a first portion connected to the third contact; and
a second portion having an upper surface being lower than an upper surface of the first portion,
a plurality of sets, each of the sets having the second, first and third active areas being arranged continuously, being arranged repeatedly in a direction perpendicular to the first direction,
positions of the second, first and third contacts in the first direction being displaced periodically by taking the set as a base unit.

12. The device according to claim 1, further comprising:
a plurality of control gate electrodes provided above the first and second active areas and extending in a second direction crossing the first direction;
a charge storage member provided on a overlapping portion of one of the plurality of control gate electrodes and one of the first and second active areas;
a tunneling insulating film provided between the charge storage member and one of the first and second active areas; and
a pair of selection gate electrodes disposed on both sides of a set including the plurality of control gate electrodes above the first and second active areas and extending in the second direction,
the first portion and the second portion being disposed on opposite sides of the set as viewed from one of the selection gate electrodes.

13. The device according to claim 12, further comprising:
a first bit line provided immediately above the first active area, extending in the first direction and being connected to an upper end of the first contact, and
a second bit line provided immediately above the second active area, extending in the first direction and being connected to an upper end of the second contact.

14. The device according to claim 12, wherein
a portion excluding the first portion from portions placed between two selection gate electrodes disposed between two of the set in each of the first and second active areas serves as the second portion.

15. The device according to claim 1, wherein
each of the first active area and the second active area further includes a third portion disposed adjacent to the second position opposite to the first position in the first direction,
the second portion has an upper surface being placed lower than an upper surface of the third portion.

16. A nonvolatile semiconductor memory device comprising:
a semiconductor substrate;
an element isolation insulator formed in an upper portion of the semiconductor substrate and dividing the upper portion into a first active area extending in a first direction and a second active area extending in the first direction;
a first contact provided above the first active area and having a lower end portion connected to the first active area; and
a second contact provided above the second active area and having a lower end portion connected to the second active area,
wherein the first contact and the second contact are mutually shifted in the first direction, and
a first region in an upper surface of the first active area being in contact with the first contact is placed higher than a second region in an upper surface of the second active area being same as a position of the first region in the first direction.

17. The device according to claim 16, wherein
a contiguous region to the first region in the upper surface of the first active area in the first direction is placed higher than the second region.

* * * * *